(12) United States Patent
Saito et al.

(10) Patent No.: US 6,369,361 B2
(45) Date of Patent: Apr. 9, 2002

(54) THERMAL PROCESSING APPARATUS

(75) Inventors: Takanori Saito; Tsuyoshi Takizawa; Kenichi Yamaga, all of Shiroyama-machi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/769,499

(22) Filed: Jan. 26, 2001

(30) Foreign Application Priority Data

Jan. 28, 2000 (JP) .......................................... 12-020149

(51) Int. Cl.$^7$ ................................................ F27B 5/14
(52) U.S. Cl. ..................... 219/390; 219/405; 219/411; 392/416; 392/418; 118/724; 118/50.1
(58) Field of Search ................................ 219/390, 405, 219/411; 392/416, 418; 118/724, 725, 50.1

(56) References Cited

U.S. PATENT DOCUMENTS

| | | | |
|---|---|---|---|
| 4,950,870 A | * | 8/1990 | Mitsuhashi et al. .......... 219/390 |
| 5,001,327 A | * | 3/1991 | Hirasawa et al. ............ 219/390 |
| 5,324,920 A | | 6/1994 | Nakao |
| 5,329,095 A | | 7/1994 | Okase |
| 5,443,648 A | * | 8/1995 | Ohkase ....................... 118/724 |
| 5,506,389 A | | 4/1996 | Hidano et al. |
| 5,567,152 A | | 10/1996 | Morimoto |
| 5,616,264 A | | 4/1997 | Nishi et al. |
| 5,676,869 A | * | 10/1997 | Nakayama et al. .......... 219/390 |
| 5,850,071 A | * | 12/1998 | Makiguchi et al. .......... 219/390 |
| 6,043,468 A | * | 3/2000 | Toya et al. .................. 219/544 |

FOREIGN PATENT DOCUMENTS

| | | |
|---|---|---|
| EP | 0 538 874 A1 | 4/1993 |
| JP | 8-8042 | 1/1996 |

OTHER PUBLICATIONS

European Office Action for counterpart application No. EP 01 10 1823, dated Jun. 22, 2001.

* cited by examiner

*Primary Examiner*—Teresa Walberg
*Assistant Examiner*—Shawntina T. Fuqua
(74) *Attorney, Agent, or Firm*—Smith, Gambrell & Russell, LLP.

(57) ABSTRACT

A thermal processing apparatus includes a reaction vessel into which an object to be processed is conveyed, a furnace body disposed so as to surround the reaction vessel, and a heater disposed in a region surrounding the reaction vessel in the furnace body. The heater includes heating elements, each having a sealing member made of a ceramic material and a linear flexible resistance heat generating member sealed by the sealing member.

29 Claims, 22 Drawing Sheets

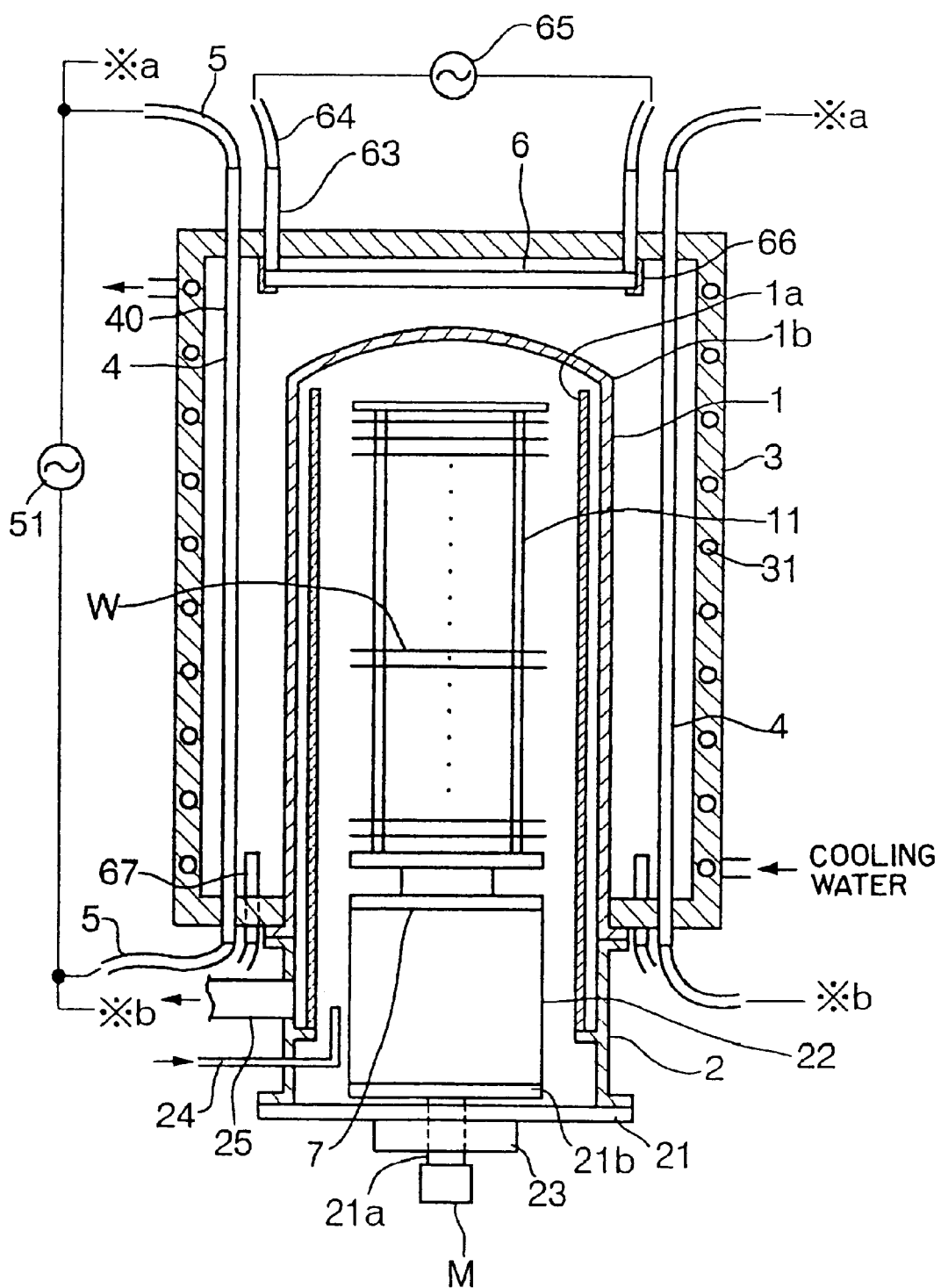
F I G. 1

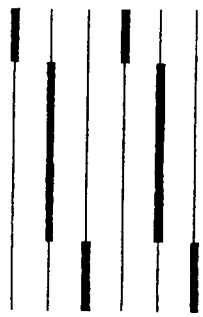 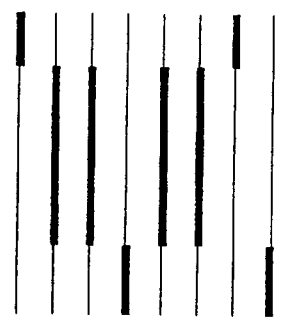 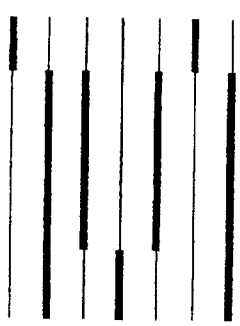
FIG. 7A    FIG. 7B    FIG. 7C
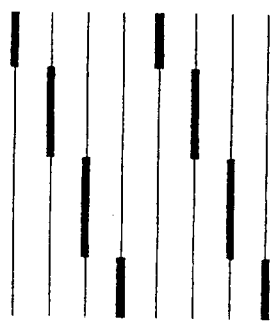 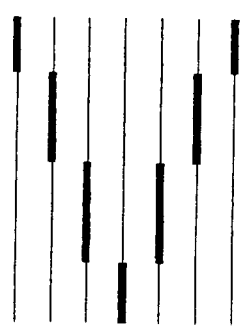
FIG. 7D    FIG. 7E

THERMAL PROCESSING APPARATUS

BACKGROUND OF THE INVENTION

1. Field of the Invention

The present invention relates to a thermal processing apparatus for the heat treatment to an object to be processed, such as a semiconductor wafer.

2. Description of the Related Art

A known vertical heat treatment apparatus, i.e., one of semiconductor device fabricating apparatuses, has a heat treatment furnace provided with a heater surrounding a vertical reaction tube. A wafer holder holding a plurality of wafers in a tier-like manner is carried into the heat treatment furnace from below the heat treatment furnace. The interior of the reaction tube is heated to a predetermined temperature to subject the wafers to a film forming process or an oxidation process.

The heater mainly consists of a heating element that is made of a metal such as an iron-chromium alloy or a ceramic material such as $MoSi_2$. The heating element is formed in a helical shape so as to surround the reaction tube or in a wavy shape so as to extend along the circumference of the reaction tube. Different parts of the heat treatment furnace may radiate heat at different rates, respectively. Thus, the heater is divided into a plurality of heater sections, such as an upper, a middle and a lower heater sections. Then, temperature controllers are combined with the heater sections, respectively, in order to control the temperature of a processing atmosphere in such a manner that the widest possible region of the processing atmosphere can be heated in a highly uniform temperature distribution. Such a mode of control is called a zone control mode.

Recently, the diameter of the wafer has been progressively increasing. In addition, the thickness of thin films has been progressively decreasing for miniaturization of semiconductor devices. Therefore, the size of the heat treatment furnace has also been progressively increasing, while highly uniform temperature distribution has been required in the processing atmosphere. Such a requirement may be met by dividing the heater into an increased number of heater sections for an increased number of heating zones, and by individually controlling respective operations of the heater sections. When such a zone control mode is employed, however, the number of the controllers increases and hence cost increases. Furthermore, maintenance work, such as work for temperature calibration, is complicated and there are practical difficulties in such a zone control mode. Therefore, it is preferable to assign one temperature controller to a wide region and to minutely control the heat generation pattern (shape and heat generating rate) of the heater.

Mechanical strength of a conventional heating element becomes insufficient if the width (or the diameter) of the heating element is reduced, therefore, a heating element having great width is used unavoidably. A heating element of a great width cannot be bent in a curve or a small radius of curvature due to the great width and the properties of a material forming the heating element; that is, a degree of freedom in bending for shaping of the heating element is small. Even if it is intended to use a heating element having a plurality of sections that have different values of resistance to generate heat at different heat generating rates, respectively, it is difficult to process a workpiece to form a heating element partly having different diameters, and the diameters cannot be freely determined because the mechanical strength of the heating element is dependent on the diameter. Thus, the minute adjustment of heat generation pattern of the heater is difficult, and it is difficult to heat the processing atmosphere to a uniform temperature distribution.

A reaction tube made of quartz may become permeable to molecules when heated to a high temperature. Therefore, there is possibility that wafers are contaminated with impurities contained in the heating element, such as a metal or a ceramic material. In some cases, a reaction tube made of SiC is used in order to suppress the permeation of impurities through the reaction tube. However, the reaction tube made of SiC has a large heat capacity. Therefore, if a reaction tube made of SiC is employed, it is possible that a characteristic of temperature control of the processing atmosphere is deteriorated, a time necessary for stabilizing the temperature is increased and a throughput of the thermal processing is reduced.

SUMMARY OF THE INVENTION

The present invention has been made in view of those problems and it is therefore an object of the present invention to provide a thermal processing apparatus capable of controlling a heat generation pattern at a high degree of freedom and of forming a processing region having a highly uniform temperature distribution.

According to the present invention, the heating element can be formed in a desired shape, and the resistance-heating element may be of a desired diameter. Therefore, sectional regulation of heat generating rate can be easily achieved; that is, the degree of freedom of design of heat generating pattern is high. Consequently, a processing region can be heated in a highly uniform temperature distribution.

Preferably, the furnace body is a heat insulating body. In the case, it is preferable to provide a cooling medium passage for introducing a cooling medium in order to cool the furnace body. In addition, it is preferable that the heater is arranged apart from an inner surface of the furnace body.

Preferably, the reaction vessel has a shape of a longitudinal cylinder, and the heater is disposed in a region facing a side surface of the reaction vessel. In the case, further preferably, the heater has a longitudinal shape, and a plurality of sealing members are arranged in parallel with the heater vessel.

In addition, preferably, a second heater is disposed in a region facing a top wall of the reaction vessel, and the second heater includes heating elements, each having a sealing member made of a ceramic material, and a linear flexible resistance heat generating member sealed by the sealing member.

In addition, preferably, a third heater is disposed in a region near to a lower end of the reaction vessel, and the third heater includes heating elements, each having a sealing member made of a ceramic material, and a linear flexible resistance heat generating member sealed by the sealing member.

Preferably the furnace body has a mirror-finished inner surface. In the case, it is similarly preferable that the heater is arranged apart from an inner surface of the furnace body.

Alternatively, the furnace body may include: a first heat reflector having an inner surface serving as a heat reflecting surface, and a second heat reflector surrounding the first heat reflector, having an inner surface serving as a heat reflecting surface capable of reflecting radiation heat transmitted through the first heat reflector. In the case, it is possible that the second heat reflector has a mirror-finished inner surface.

Preferably, each of the heating elements has terminals protruded through the furnace body.

In addition, preferably, the resistance heat generating member has sections respectively having different cross sectional areas. Further preferably, the resistance heat generating member has sections respectively generating heat at different heat generating rates.

It is preferable that a space surrounding the reaction vessel is divided into a plurality of vertical regions, and that the heating elements are disposed in the plurality of vertical regions, respectively. Alternatively, it is preferable that a space surrounding the reaction vessel is divided into a plurality of circumferential regions, and that the heating elements are distributed in the plurality of circumferential regions. Alternatively, it is preferable that a space surrounding the reaction vessel is divided into a plurality of radial regions, and that the heating elements are distributed in the plurality of radial regions.

For example, the sealing member may be formed into a longitudinal shape, an U-like shape or a meandering shape.

For example, the resistance heat generating members may be a carbon wire that is formed by twisting strands of fine carbon members. The ceramics material may be for example quartz.

In addition, the thermal processing apparatus may comprise a holder capable of holding a plurality of objects to be processed in a tier-like manner and of being carried into the reaction vessel from below the reaction vessel.

In the case, preferably, the holder may have a lid capable of hermetically closing an open end of the reaction vessel, and a heat insulating unit disposed on the lid. In addition, it is preferable that a fourth heater is disposed in the heat insulating unit, and that the fourth heater includes heating elements, each having a sealing member made of a ceramic material, and a linear flexible resistance heat generating member sealed by the sealing member.

BRIEF DESCRIPTION OF THE DRAWINGS

FIG. 1 is a schematic sectional view of a vertical thermal processing apparatus of a first embodiment according to the present invention;

FIGS. 7A to 7E are developments of other examples of arrangements of heating elements;

DESCRIPTION OF THE PREFERRED EMBODIMENTS

Figure 2:
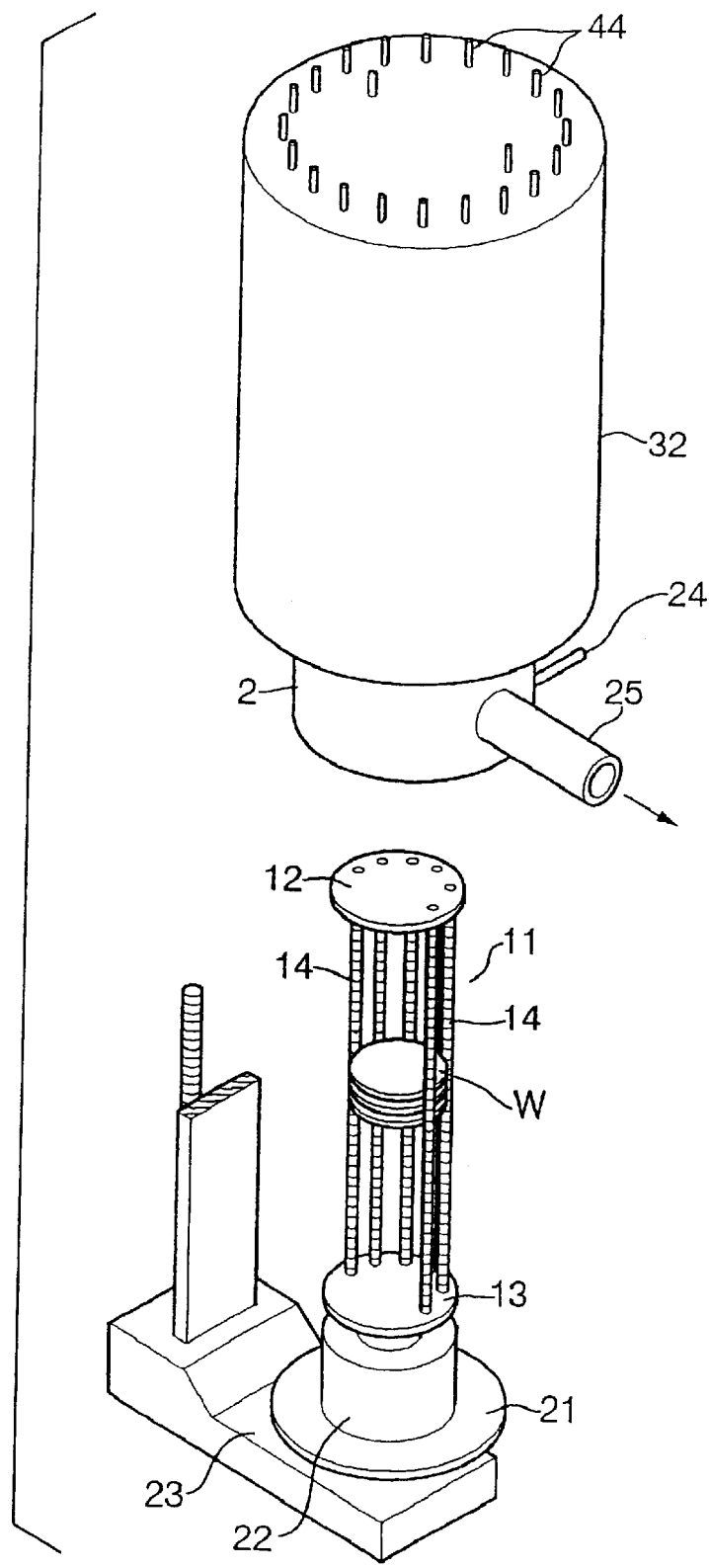
FIG. 2 is an exploded perspective view of an essential part of the vertical thermal processing apparatus shown in FIG. 1.

FIG. 1 is a view showing a vertical thermal processing apparatus of a first embodiment according to the present invention, and FIG. 2 is a schematic view of the vertical thermal processing apparatus shown in FIG. 1. With reference to FIG. 1, the vertical thermal processing apparatus in the embodiment has a reaction tube 1 of a double-wall structure consisting of an inner tube 1a and an outer tube 1b. The inner tube 1a and the outer tube 1b are made of, for example, quartz. A cylindrical manifold 2 made of a metal is joined to a lower end of the reaction tube 1.

The inner tube 1a has an open upper end, and a lower end inserted in and supported on the manifold 2. The outer tube 1b has a closed upper end, and a lower end hermetically joined to an upper end of the manifold 2. The inner tube 1a, the outer tube 1b and the manifold 2 constitute a reaction vessel.

A water boat 11 (holder) holding a plurality of wafers W (objects to be processed), for example, 126 wafers W, in a tier-like manner (in respective horizontal planes at vertical intervals) is placed in the reaction tube 1. As shown in FIG. 2, the wafer boat 11 has a top wall 12, a bottom wall 13 and a plurality of support rods 14 extended between the top wall 12 and the bottom wall 13. The support rods 14 are provided with horizontal grooves for receiving peripheral parts of wafers W therein. The wafer boat 11 is held on a lid 21 via a cylindrical heat insulating unit 22 made of, for example, quarts. More specifically, a turntable 21b is mounted on a rotating shaft 21a penetrating the lid 21 and driven by a motor M. The heat insulating unit 22 is mounted on the turntable 21b. The lid 21 is mounted on a boat elevator 23 for carrying (conveying) the wafer boat 11 into and out from the reaction tube 1. When the lid 21 is positioned at its uppermost position, the lid 21 is adapted to close the open lower end of the manifold 2, i.e., the open lower end of the reaction vessel formed by the reaction tube 1 and the manifold 2.

A plurality of gas supply pipes are arranged around the manifold 2. Thus, a plurality of process gases can be supplied into the inner tube 1a through the gas supply pipes. In FIG. 1, only one gas supply pipe 24 among the plurality of gas supply pipes is shown. The gas supply pipe 24 is connected to a gas source, not shown. A discharge pipe 25 is connected to the manifold 2 to discharge gases from a space between the inner tube 1a and the outer tube 1b. The discharge pipe 25 is connected to a vacuum pump, not shown, to maintain an interior of the reaction tube 1 at a predetermined vacuum atmosphere.

A cylindrical heat reflector 3 having a closed upper end and a lower end hermetically joined to a lower portion of the reaction tube 1 is disposed so as to cover the reaction tube 1. The heat reflector 3 is made of, for example, aluminum. The heat reflector 3 has a mirror-finished inner surface to suppress dissipation of radiation heat radiated by a heater, which will be described later. A helical cooling water passage 31 is formed in the heat reflector 3 as a cooling medium passage. The cooling medium passage is not limited to a narrow passage but may be a wide passage like a wide room.

Figure 3A:
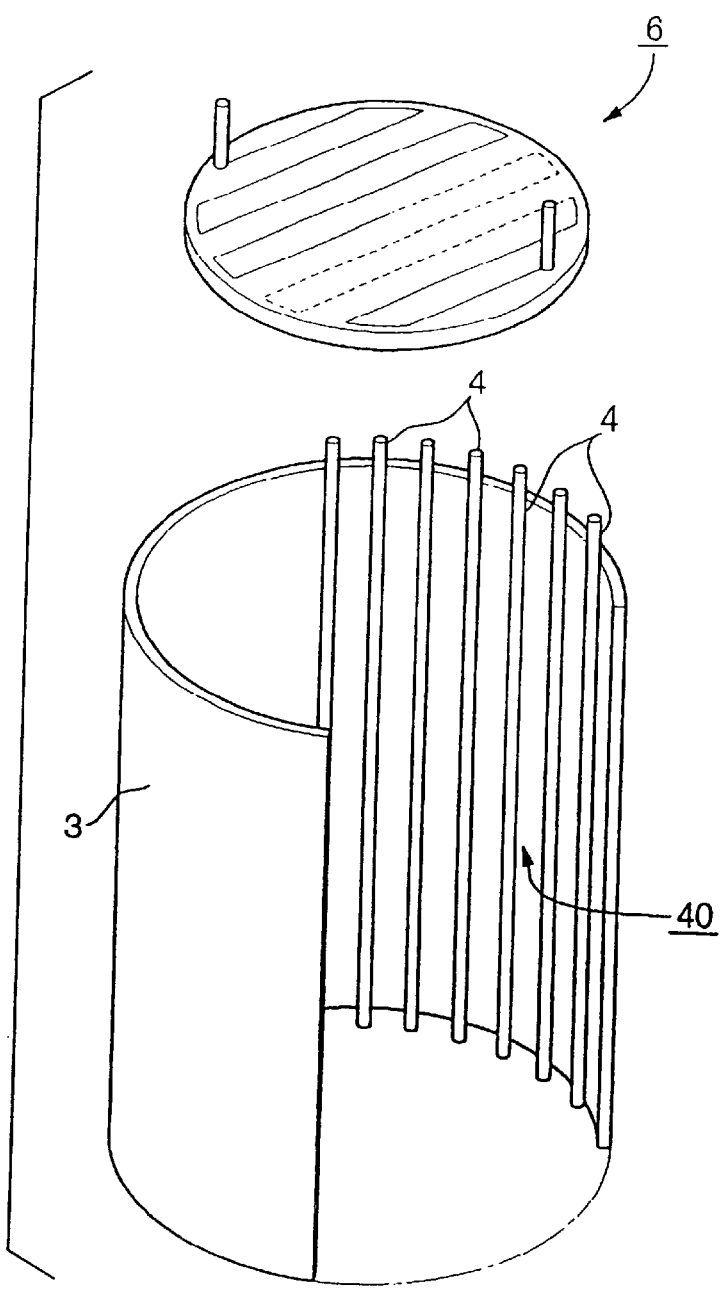
FIG. 3A is a schematic perspective view of a heater and a first subheater included in the vertical thermal processing apparatus shown in FIG. 1.
Figure 3B:
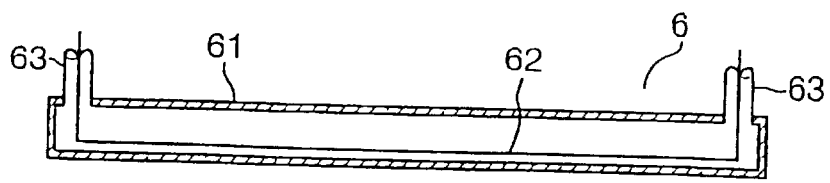
FIG. 3B is a schematic sectional view of the first subheater shown in FIG. 3A.
Figure 4A:
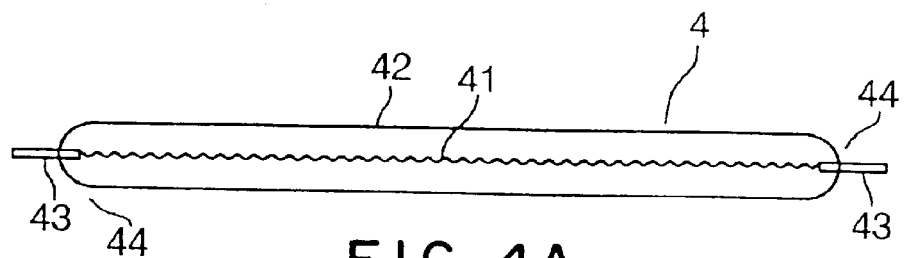
FIGS. 4A and 4B are views of an example of a heating element.

As shown in FIGS. 1 and 3, a plurality of vertical, long tubular heating elements 4, as an example, are arranged along and several millimeters apart from the inner circumference of the side wall of the heat reflector 3 at circumferential intervals of, for example, several centimeters. The heating elements 4 constitute a heater 40. As shown in FIG. 4A, each heating element 4 has a linear, flexible resistance heat generating member of a high purity, such as a carbon wire 41 formed by twisting (braiding) a plurality of strands of carbon fibers of about 10 μm in diameter. The carbon wire 41 is sealed in a sealing member of a ceramic material, such as a transparent quartz tube 42 having an outside diameter of ten-some millimeters.

Electrodes 43 are connected to opposite ends of the carbon wire 41. Opposite end parts of the quartz tube 42 are sealed around the electrodes 43, respectively. Outer parts of the electrodes 43 projecting outside from the quartz tube 42 serve as terminals 44. The electrodes 43 are connected to the carbon wire 41 in the quartz tube 42 in this embodiment. However, the carbon wire 41 may have opposite, thick end parts of a diameter greater than that of the rest of the carbon wire 41, which end parts generate heat at a heat generating rate lower than that at which the rest of the carbon wire 41 generate heat. In the case, opposite end parts of the quartz tube 42 may be sealed around the opposite thick end parts of the carbon wire 41 and the electrodes may be connected to the opposite thick end parts outside the quartz tube 42.

Figure 4B:
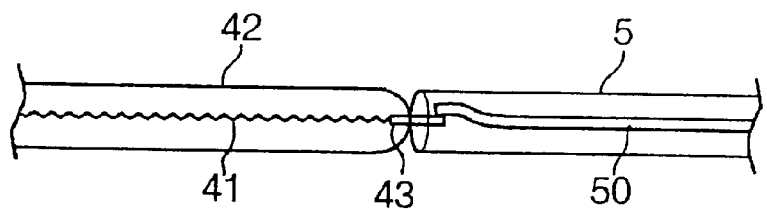

As shown in FIG. 1, the terminals 44 projecting from the upper and the lower ends of each heating element 4 penetrate the upper and the lower walls of the heat reflector 3, which may be of a heat insulating structure, and are connected to a cable 5 extending outside the heat reflector 3. More specifically, as shown in FIG. 4B, the electrode 43 is connected to the conductor 50 of the cable 5 by, for example, brazing or crimping.

The cable 5 is connected to a power circuit 51. Electric power may be supplied to the heating elements 4 by, for example, connecting all the heating elements 4 in parallel to the common power circuit 51 or by dividing the heating elements 4 into a plurality of groups, connecting the heating elements 4 of each group in series, and connecting the groups of series-connected heating elements in parallel to the power circuit 51. Alternatively, the heating elements 4 of each group may be connected in series and/or in parallel, the groups of the heating elements 4 may be connected to power circuits 51, respectively, and power supply operations for supplying power to the groups may be individually controlled. The heating elements 4 may be divided into n equal circumferential groups or may be divided into n groups each including every n circumferential successive heating elements 4.

Figure 5A:
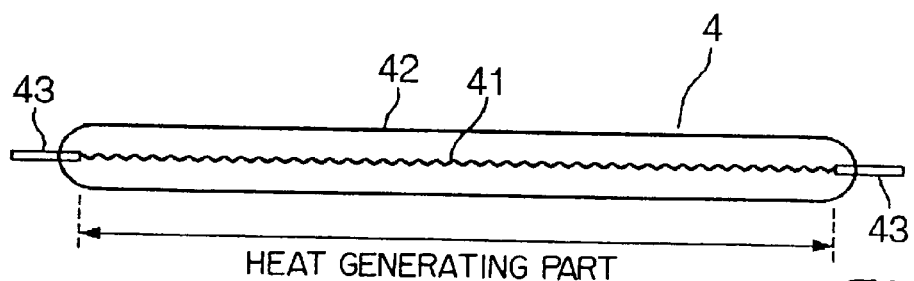
FIGS. 5A, 5B and 5C are views of another example of a heating element.
Figure 5B:
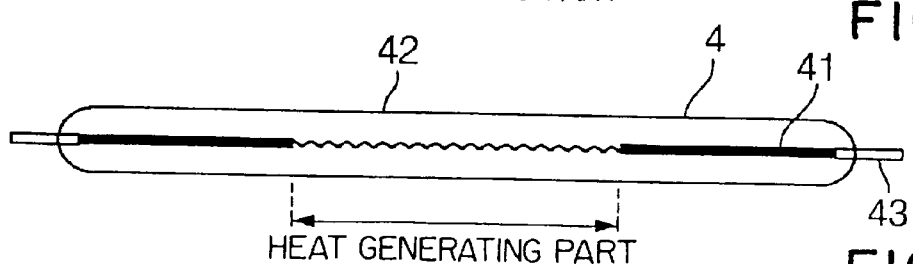
Figure 5C:
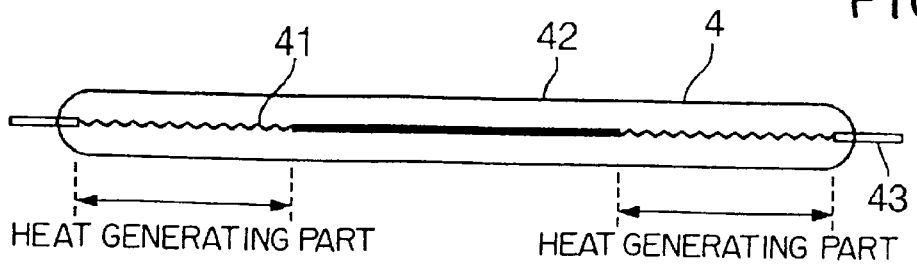

The heating elements 4 will be further described with reference to FIGS. 5A to 5C. The heat generating rate per unit length of the heating element 4 is dependent on the diameter of the carbon wire 41. In this embodiment, the diameter of the carbon wire 41 may be determined so that the entire heating element 4 excluding the terminals generate heat, as shown in FIG. 5A. Alternatively, the carbon wire 41 may have thick parts and thin parts, as shown in FIG. 5B or 5C, that is, parts respectively having different diameters and capable of generating heat respectively at different heat generating rates. For example, the carbon wire 41 may have a thin part of 2 mm in diameter that can generate heat at 1.5 kW/m, i.e., a high-capacity part that can generate heat at a high heat generating rate, and a thick part of 4 mm or above in diameter that can generate heat at 0.375 kW/m or below, i.e., a low-capacity part that can generate heat at a low heat generating rate. The term high-capacity part and low-capacity part herein refers to the amount of heat generated by the heat generating member. The amount of heat generated refers to the amount of heat contributing to the heating of the process atmosphere. From a viewpoint of the processing atmosphere, high-capacity part generates heat at high generating rate, and therefore, contributes highly to the heating of the processing atmosphere.

Figure 6:
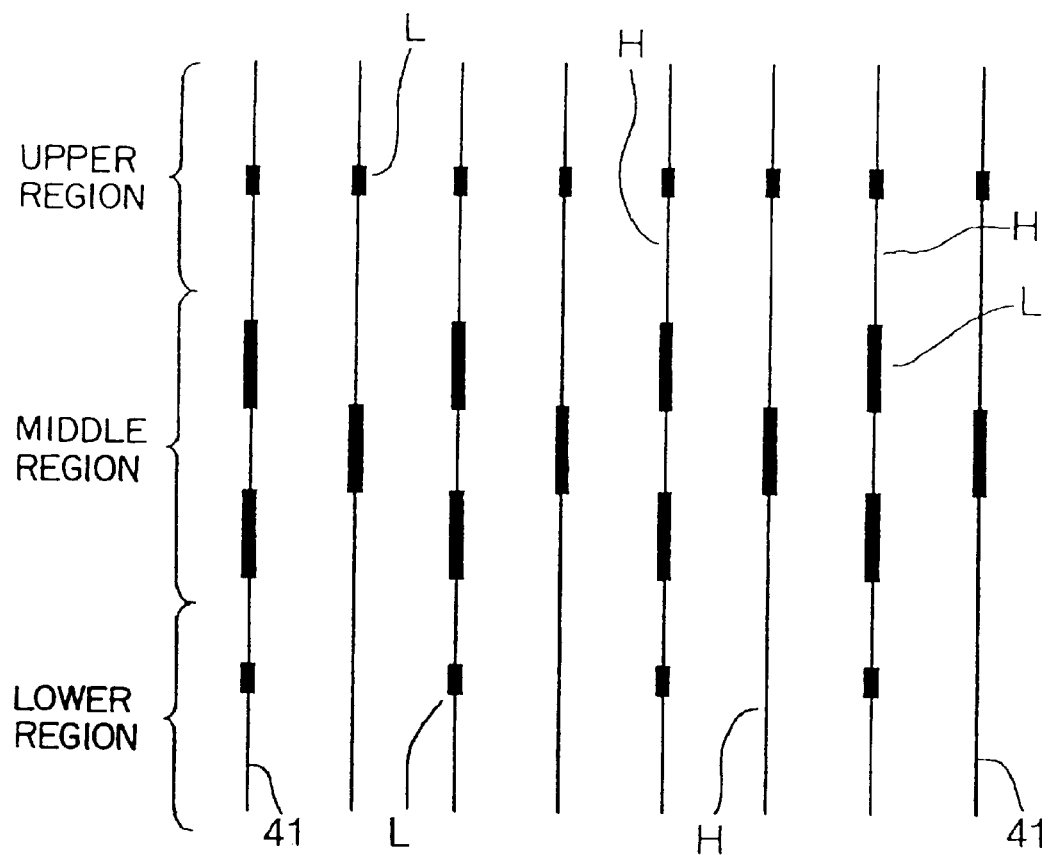
FIG. 6 is a development of an example of an arrangement of heating elements.

FIG. 6 is a typical view showing a pattern in which high-capacity parts H and low-capacity parts L of the carbon wires 41 are arranged. In FIG. 6, a processing space in which wafers W are processed is divided into three regions, i.e., an upper region, a middle region and a lower region. The pattern is designed so that the carbon wires 41 generate heat at a high heat generating rate, a medium heat generating rate and a low heat generating rate, in the lower, the upper and the middle region, respectively. A pattern of arrangement of the high-capacity parts H and the low-capacity parts L may be optionally (freely) determined. FIGS. 7A to 7E show various patterns of arrangement of the high-capacity parts H and the low-capacity parts L of the carbon wires 41. The processing space is divided into three regions in FIGS. 7A to 7C, and the processing space is divided into four regions in FIGS. 7D and 7E.

Referring again to FIG. 1, a plate-shaped first subheater 6 is disposed under the top wall of the heat reflector 3, oppositely to the upper surface of the reaction tube 1. As shown in FIGS. 3A and 3B, the first subheater 6 has a hollow quartz disk (quartz plate) 61 of, for example, about 8 mm in thickness, and a bent carbon wire 62 similar to the carbon wire 41 and inserted in the quartz plate 61. Quartz tubes 63 are welded to two peripheral parts of the quartz plate 61. The carbon wire 62 has thick opposite end parts that can generate heat at a low heat generating rate, which parts are extended in the quarts tubes 63. The quartz tubes 63 serve as terminals. That is, as shown in FIG. 1, the quartz tubes 63 penetrate the heat reflector 3 (or a heat insulating structure) and extend outside from the heat reflector 3, and are connected to a cable 64, similarly to the heating elements 4, through electrodes not shown. In FIG. 1, indicated at 65 is a power circuit. The first subheater 6 is supported by support members 66, for example, on the top wall of the heat reflector 3.

A second subheater has a plurality of short heating elements 67 extending upward from, for example, the bottom wall of the heat reflector 3. The heating elements 67 are arranged on a circle radially inside a circle on which lower parts of the heating elements 4 are arranged. Each of the heating elements 67, similarly to the heating elements 4, is formed by sealing a carbon wire in a quartz tube. The heating elements 67 do not need to be formed and arranged as shown in FIG. 1; the heating elements 67 may be formed in a wavy shape and arranged so as to surround the reaction tube 1 or may be formed in other desired shape and arranged in a desired pattern. A plate-shaped third subheater 7 having a construction similar to that of the first subheater 6 is disposed on top of the heat insulating unit 22.

A heat treatment (thermal) process using the foregoing thermal processing apparatus will be briefly explained. A predetermined number of wafers W (objects to be processed) are held in the tier-like manner in the wafer boat 11. The wafer boat 11 holding the wafers W is raised and carried into the reaction vessel by means of the boat elevator 23. After the wafers W (the wafer boat 11) has been carried into the reaction vessel and the open lower end of the reaction vessel (open lower end of the manifold 2) has been closed with the lid 21, electric power supplied to the heaters 40, 6, 67 and 7 is increased in order to increase the heat generating rates to heat the processing atmosphere, for example, to a predetermined temperature. At the same time, the reaction vessel is evacuated to a predetermined vacuum through the discharge pipe 25 by the vacuum pump, not shown.

After the temperature of the processing atmosphere in the reaction vessel has stabilized, a process gas is supplied through the gas supply pipe 24 into the reaction vessel (the reaction tube 1 and the manifold 2) and a pressure in the reaction vessel is maintained at a predetermined vacuum. Then, the wafer boat 11 is rotated by the motor M. The process gas diffuses in the processing atmosphere and is decomposed, whereby active species are deposited as a thin film on the wafers W. Then, power supplied to the heaters 40, 6, 67 and 7 is reduced in order to reduce the heat generating rates. After the temperature of the atmosphere in the reaction vessel has dropped, the wafer boat 11 is carried out of the processing vessel.

The foregoing embodiment achieves the following effects.

The heater 40 is formed by arranging the heating elements 4 each formed by sealing the carbon wire 41 in the thin quartz tube 42. The heating elements 4 can be easily bent and hence the heater 40 can be formed in an optional shape. Although the heating elements 4 in the foregoing embodiment is straight for simplicity of description, the selection of the shape of the heating elements 4 is optional, which will be described later. The carbon wire 41 can be formed in an optional diameter by selectively determining the number of the fine carbon members forming each carbon fiber strand and the number of the carbon fiber strands. Therefore, local adjustment of the resistance, i.e., local adjustment of the heat generating rate can be easily achieved. Thus, the heat generation pattern (the shape and the heat generating rate) of the heater 40 can be optionally determined.

A conventional heater is divided into a plurality of heat generating zones, and respective temperatures of the heat generating zones are controlled individually by respective temperature controllers. However, the heater 40 of this embodiment including the heating elements 4 can be virtually divided into a plurality of heat generating zones by adjusting the heat generating pattern of the heating elements 4. For example, optionally stepped heat generating rates per unit area (in this specification, "heat generating rate" signifies heat generating rate at which heat is generated in a region where the heater 40 is disposed) can be set for successive, vertically stepped regions of the processing space. Consequently, a wide region of the processing space can be heated in a uniform temperature distribution, which increases yield of the thermal process.

Since the plate-shaped subheater (the first subheater) 6 is disposed above the reaction vessel, the amount of heat dissipated from the processing atmosphere through the top wall of the heat reflector 3 can be reduced. Especially, since the shape and the heat generating rate of the carbon wire 62 of the subheater 6 can be easily adjusted, the uniformity of temperature distribution in the vicinity of an upper portion of the wafer boat 11 can be further improved by adjusting the heat generation pattern of the subheater 6 in addition to the adjustment of the heat generation pattern of the heating elements 4.

In addition, since the second subheater including the heating elements 67 is disposed on the bottom wall of the furnace body (the bottom wall of the heat reflector 3), and the third subheater 7 is disposed on top of the heat insulating unit 22, the amount of heat dissipated through a lower part of the furnace body can be reduced. Particularly, since the shapes and heat generating rates of the second subheater including the heating elements 67 and the third subheater 7 can be easily adjusted, the uniformity of temperature distribution in a region around a lower part of the wafer boat 11 can be further improved.

In addition to the foregoing effects, the temperature can be increased at a high rising rate and decreased at a high dropping rate because each of the carbon wires 41 and 62 has a small heat capacity. A recovery time (a time necessary for temperature stabilization) after the processing space has been heated to a desired processing temperature is short, which increases the throughput of the thermal process. Generally, impurity contents of the carbon wires of the heaters 40, 6, 67 and 7 and impurity contents of the quartz tubes and the quartz plate sealing the carbon wires therein are very small. Therefore, the objects to be processed, such as wafers W are scarcely contaminated.

Figure 8:
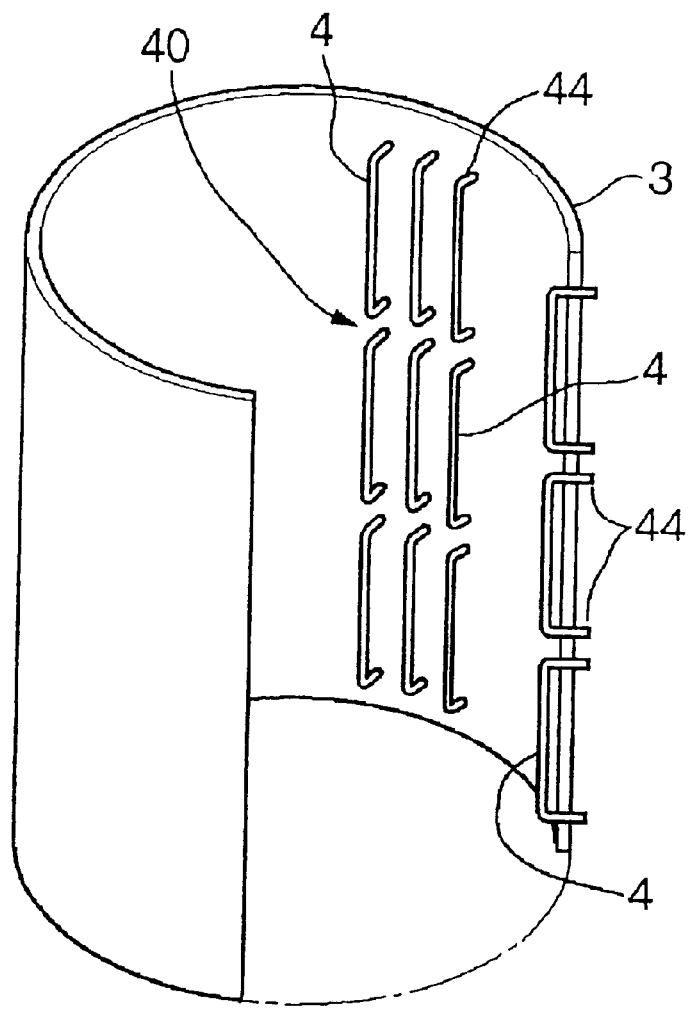
FIG. 8 is a schematic perspective view of another possible heater.

Then, a heater 40 shown in FIG. 8 has U-shaped heating elements 4. A plurality of vertical rows, each row including a plurality of heating elements 4, for example, three heating elements 4 in a line, are arranged along the inner surface of the side wall of a heat reflector 3. Terminals 44 formed in opposite end parts of each heating element 4 are extended through the side wall of the heat reflector 3 so as to project outside from the heat reflector 3. Thus, in the heater 40 shown in FIG. 8, the heating elements 4 are divided into a plurality of groups with respect to vertical and circumferential directions.

Figure 9:
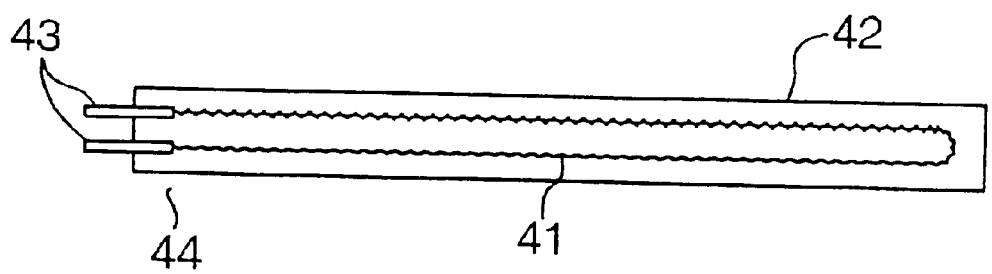
FIG. 9 is a view of another example of a heating element.
Figure 10:
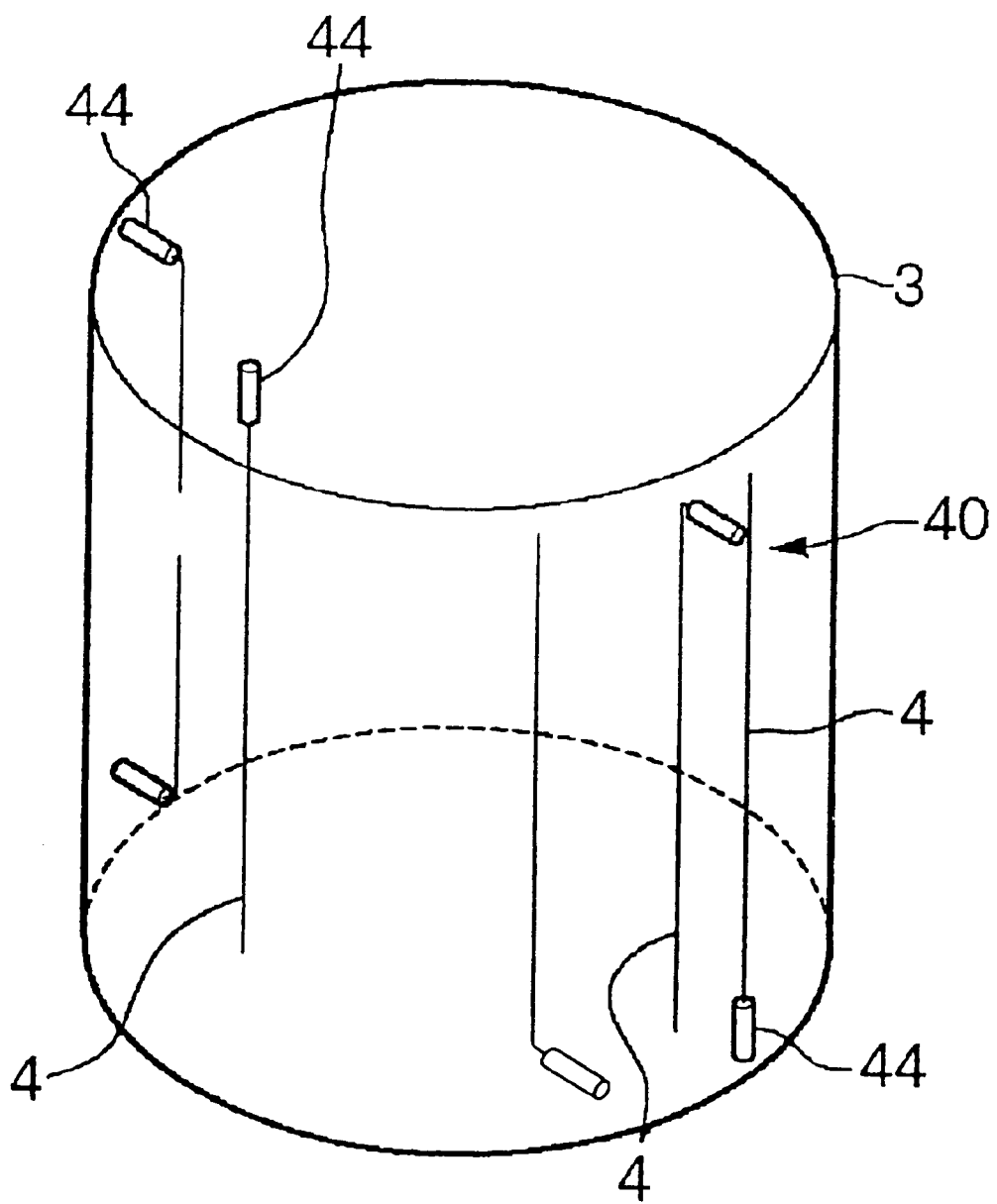
FIGS. 10 to 17 are schematic perspective views of various examples of heaters.

A heating element 4 shown in FIG. 9 may be used. The heating element 4 shown in FIG. 9 has a quartz tube 42, a pair of electrodes 43 held in a first end part of the quartz tube 42 and a carbon wire 41 inserted through the first end part in the quartz tube 42, turned back in a second end part of the quartz tube 42. FIG. 10 shows different patterns of arrangement of such heating elements 4 as shown in FIG. 9. As shown in FIG. 10, some heating elements 4 are extended between the top and the bottom walls of a heat reflector 3 and terminals 44 thereof are extended through the top, the bottom or the side walls of the heat reflector 3. Shown also in FIG. 10 are a plurality of heating elements 4 (two heating elements 4 in FIG. 10) arranged in a vertical row and each having one terminal extended through the side wall of the heat reflector 3. In FIG. 10, each heating element 4 is indicated by a line, and each terminal 44 is represented by a cylinder.

Figure 11:
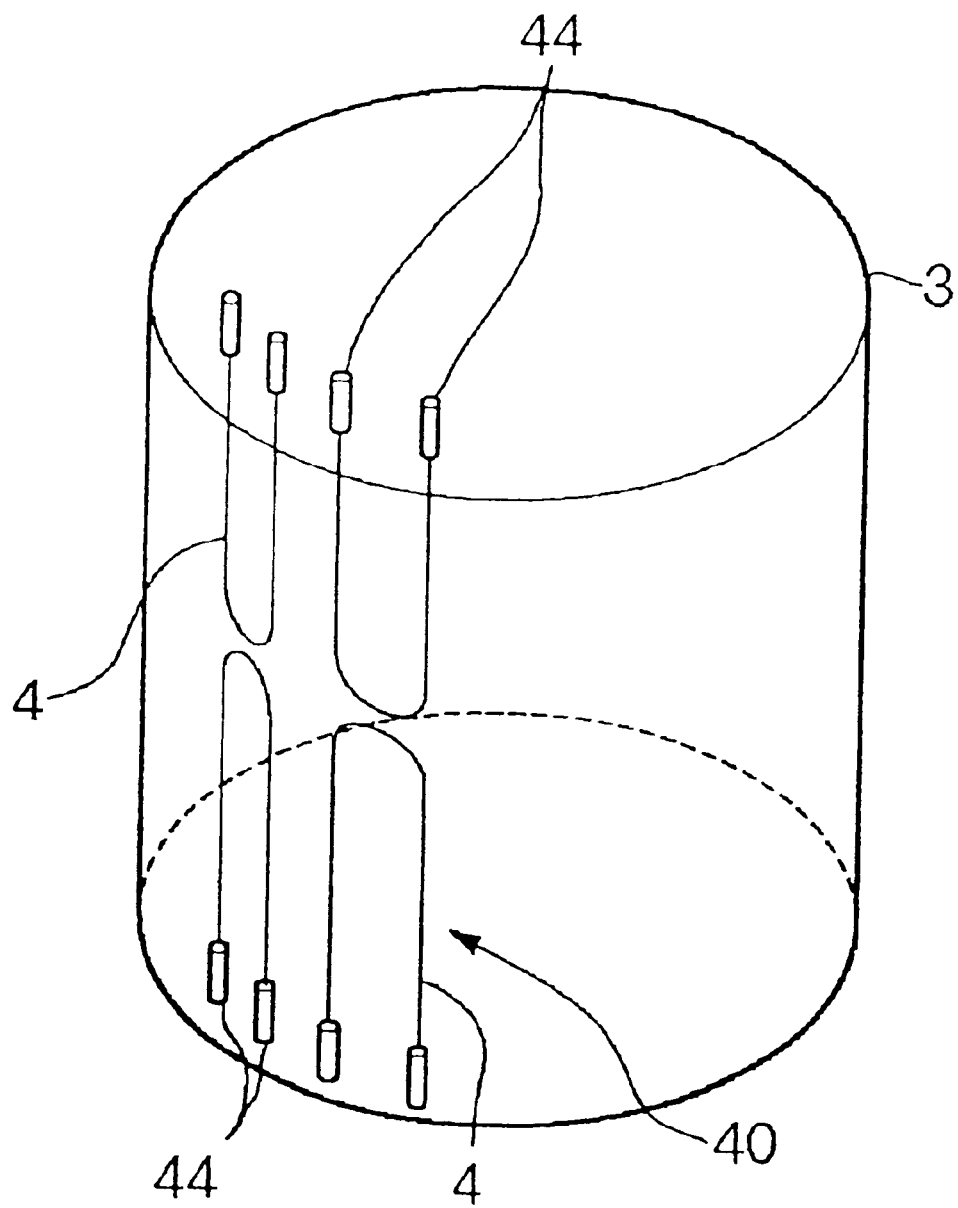
Figure 12:
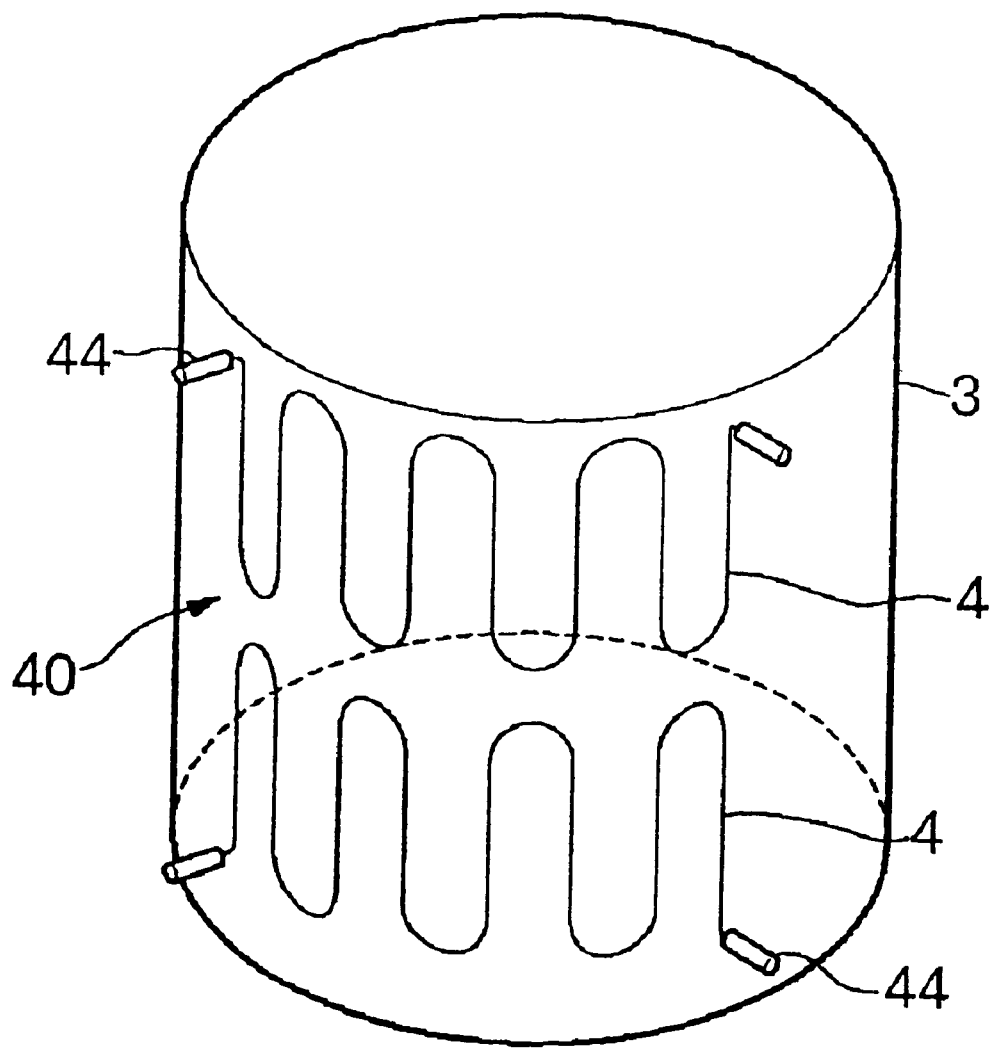

Heating elements 4 shown in FIG. 11 may be used. The heating elements 4 shown in FIG. 11 are formed in a U-shape. A heater 40 may be formed by disposing the heating elements 4 in vertical rows each of the two heating elements 4, extending terminals 44 formed in opposite end parts of each heating element 4 through the top or the bottom wall of a heat reflector 3 and arranging the vertical rows of the heating elements 4 along the side wall of the heat reflector 3. Heating elements 4 shown in FIG. 12 may be used. As shown in FIG. 12, the heating elements 4 are formed in a wavy shape (meandering shape) and terminals 44 formed in opposite end parts of each heating element 4 may be extended through the side wall of a heat reflector 3. Although the heat reflectors 3 in the foregoing examples are supposed to have the shape of a circular cylinder, the same may have the shape of a polygonal pillar having a triangular, square or polygonal cross section.

Figure 13:
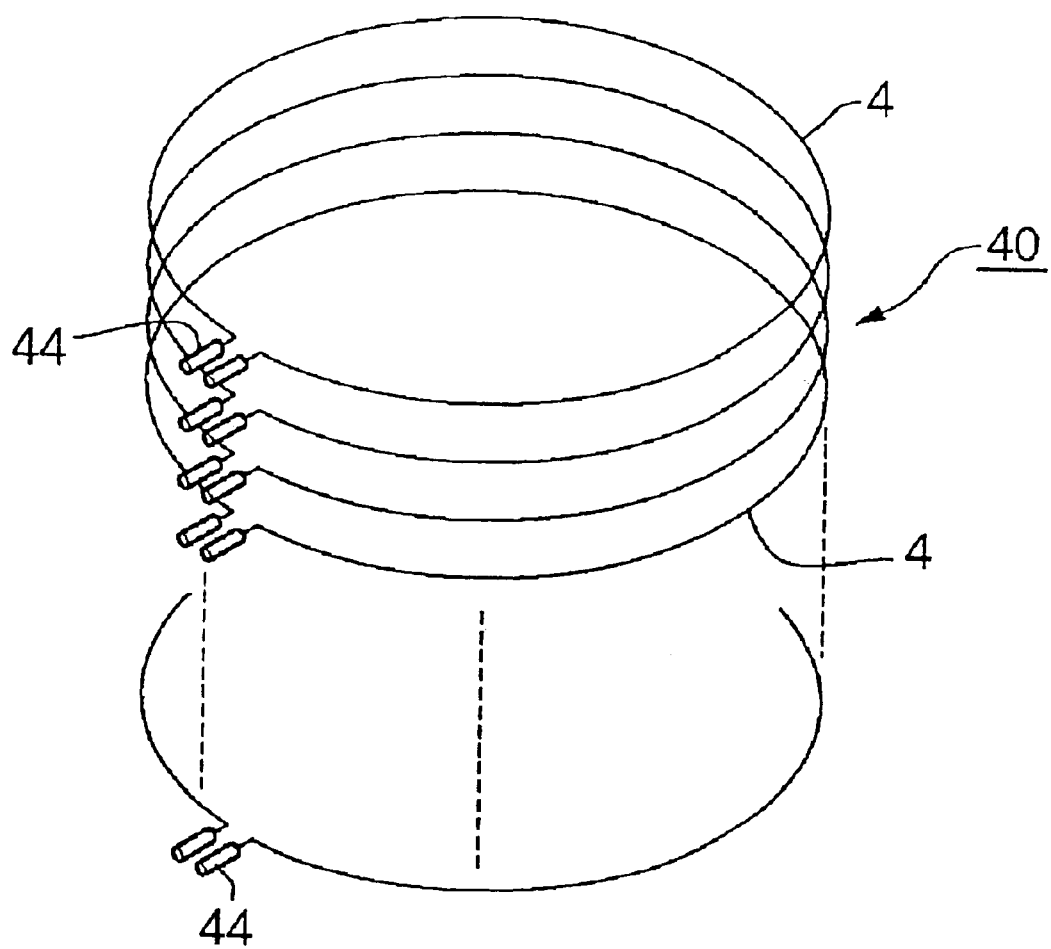
Figure 14:
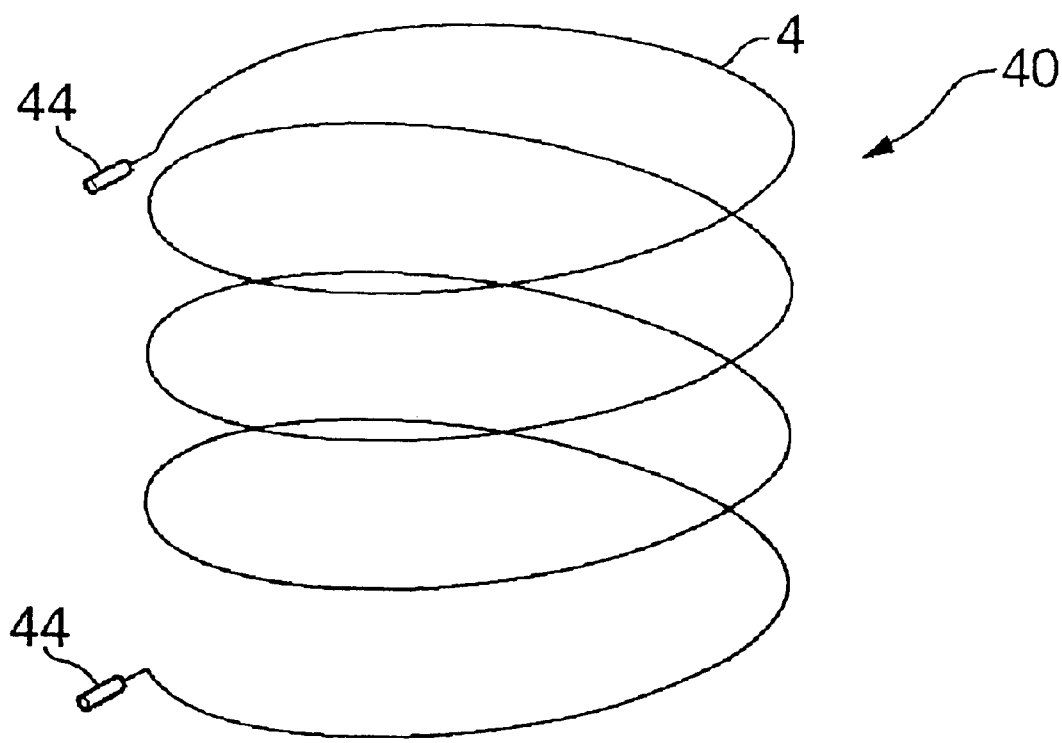
Figure 15:
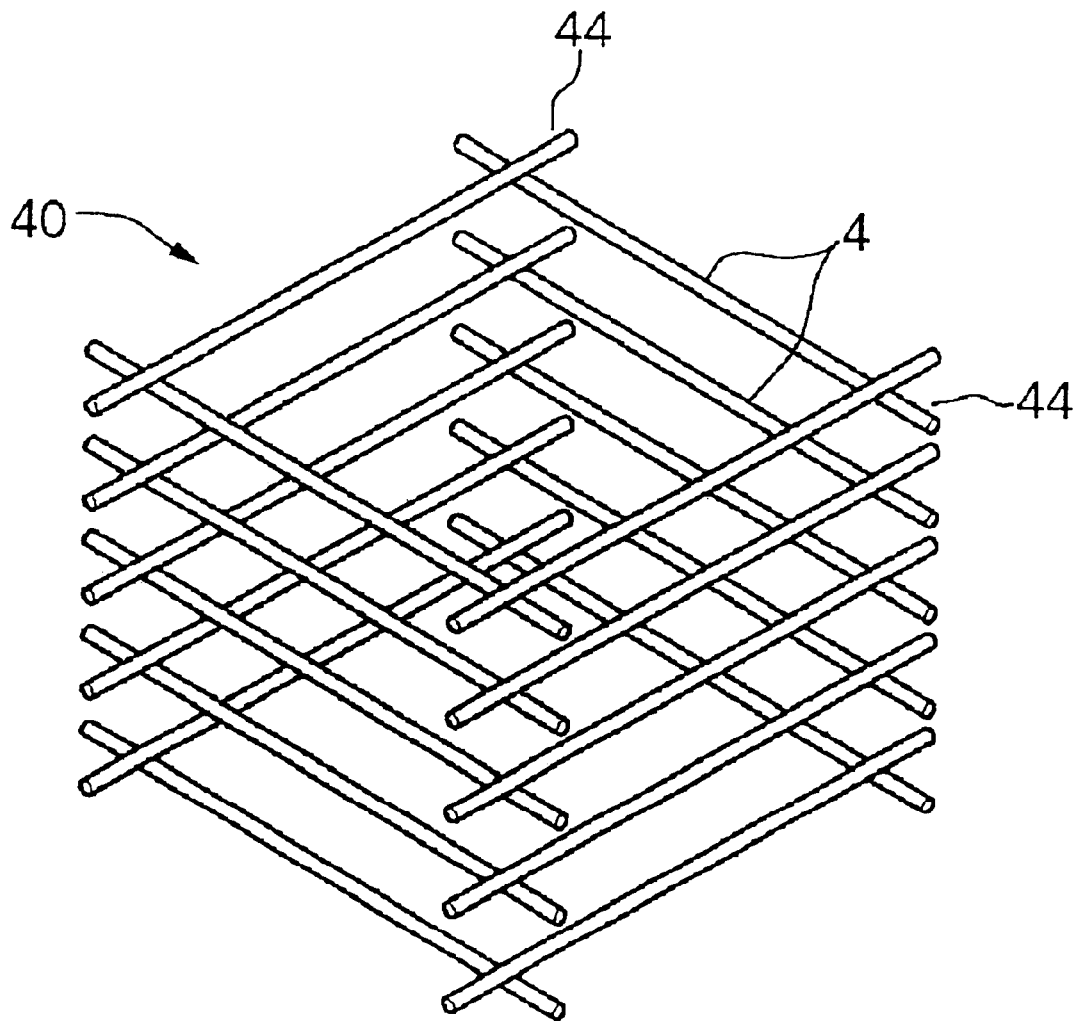
Figure 16:
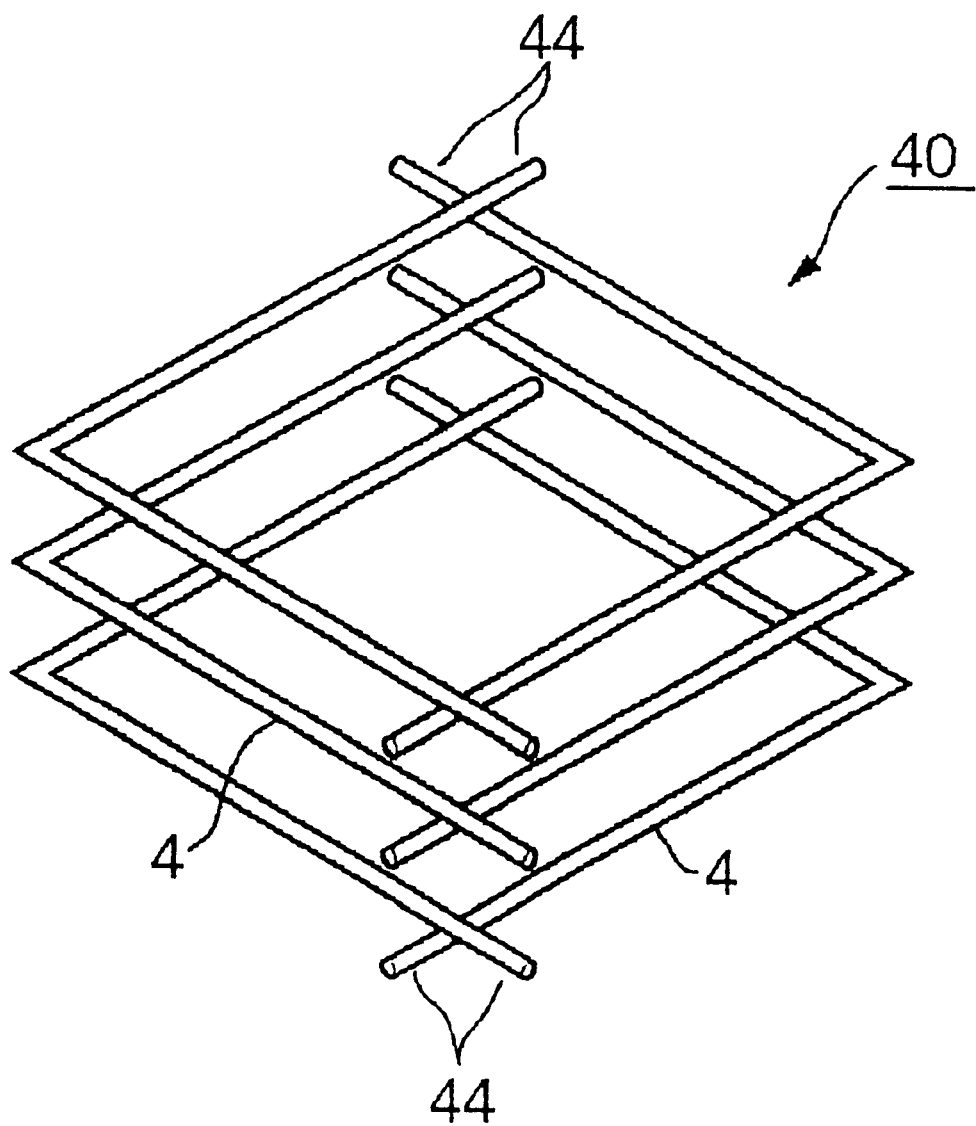
Figure 17:
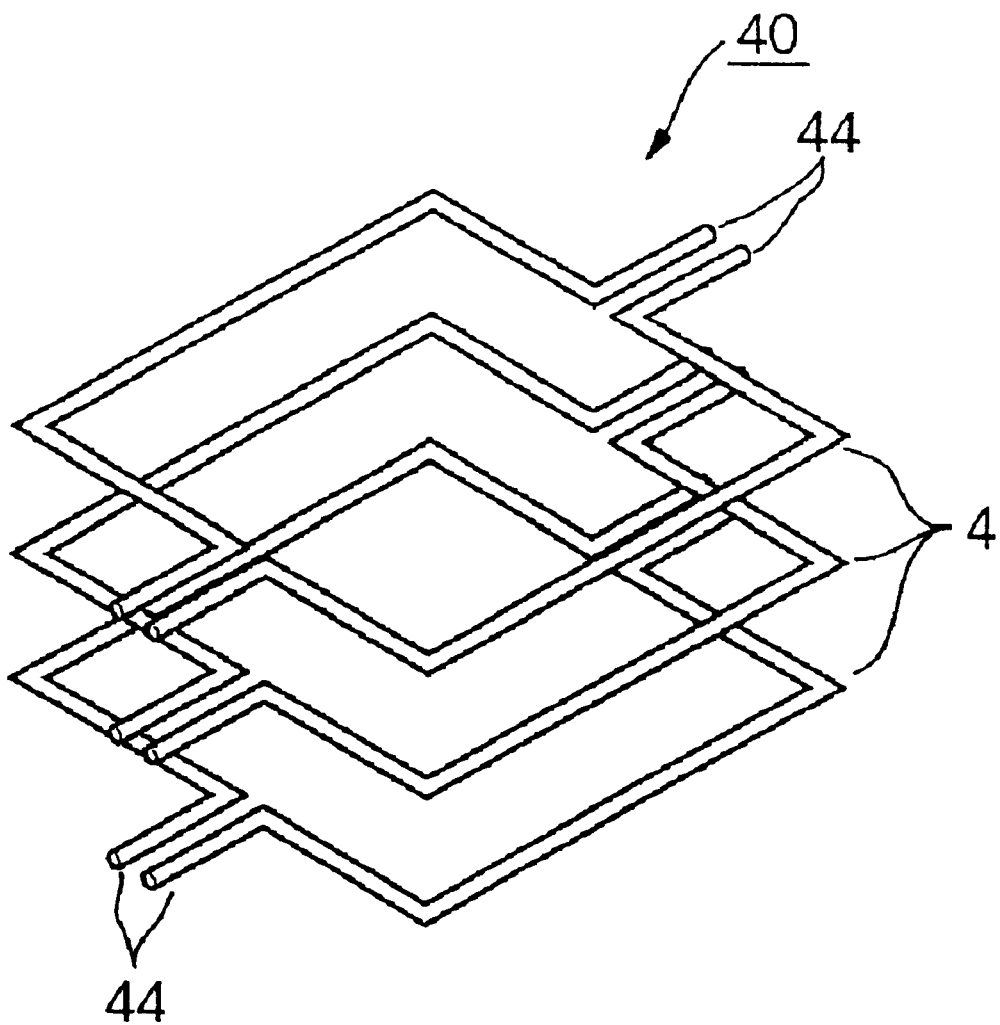

Heaters 40 shown in FIGS. 13 and 14 may be used. The heater 40 shown in FIG. 13 has a plurality of circular heating elements 4 arranged at vertical intervals. The heater 40 shown in FIG. 14 has a helical heating element 4. A heater 40 shown in FIG. 15 may be used. The heater 40 shown in FIG. 15 has a plurality of square heating structures each including four straight heating elements 4 combined in a substantially square shape. The plurality of square heating structures are arranged at vertical intervals. Shown in FIGS. 16 and 17 are possible heaters 40. The heater 40 shown in FIG. 16 has a plurality of square heating structures each including two L-shaped heating elements 4 combined in a square shape. The square heating structures are arranged at vertical intervals. The heater 40 shown in FIG. 17 has a plurality of square heating structures each including two U-shaped heating elements 4 combined in a square shape. The square heating structures are arranged at vertical intervals. The heating elements 4 may be combined in triangular or polygonal heating structures instead of in the square heating structures.

The heating elements 4 may be arranged along two coaxial imaginary cylinders of different diameters surrounding and coaxial with the reaction vessel. Heaters of such a construction will be described with reference to FIGS. 18 to 22.

Figure 18:
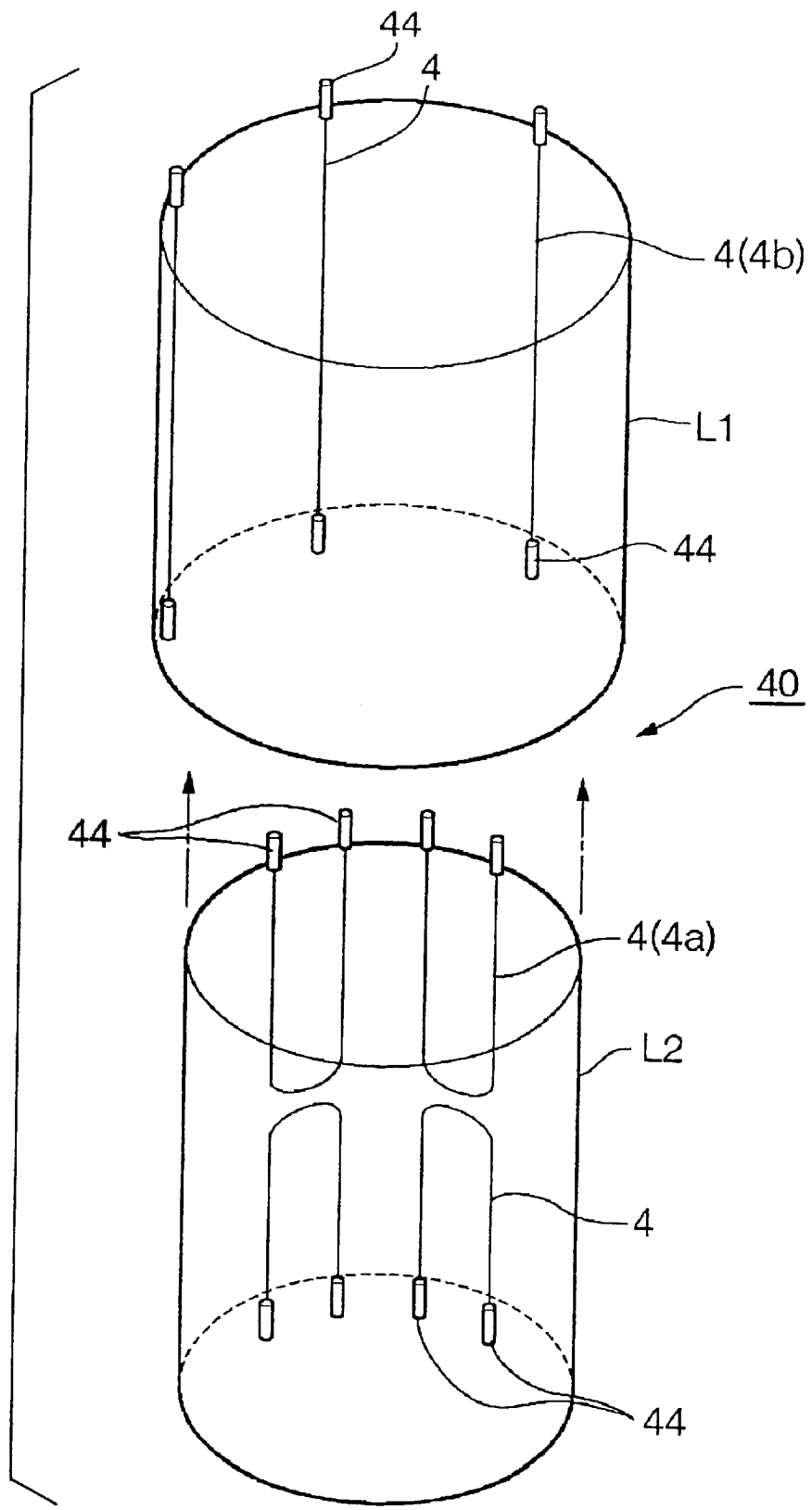
FIG. 18 is an exploded perspective view of an example of a heater.
Figure 19:
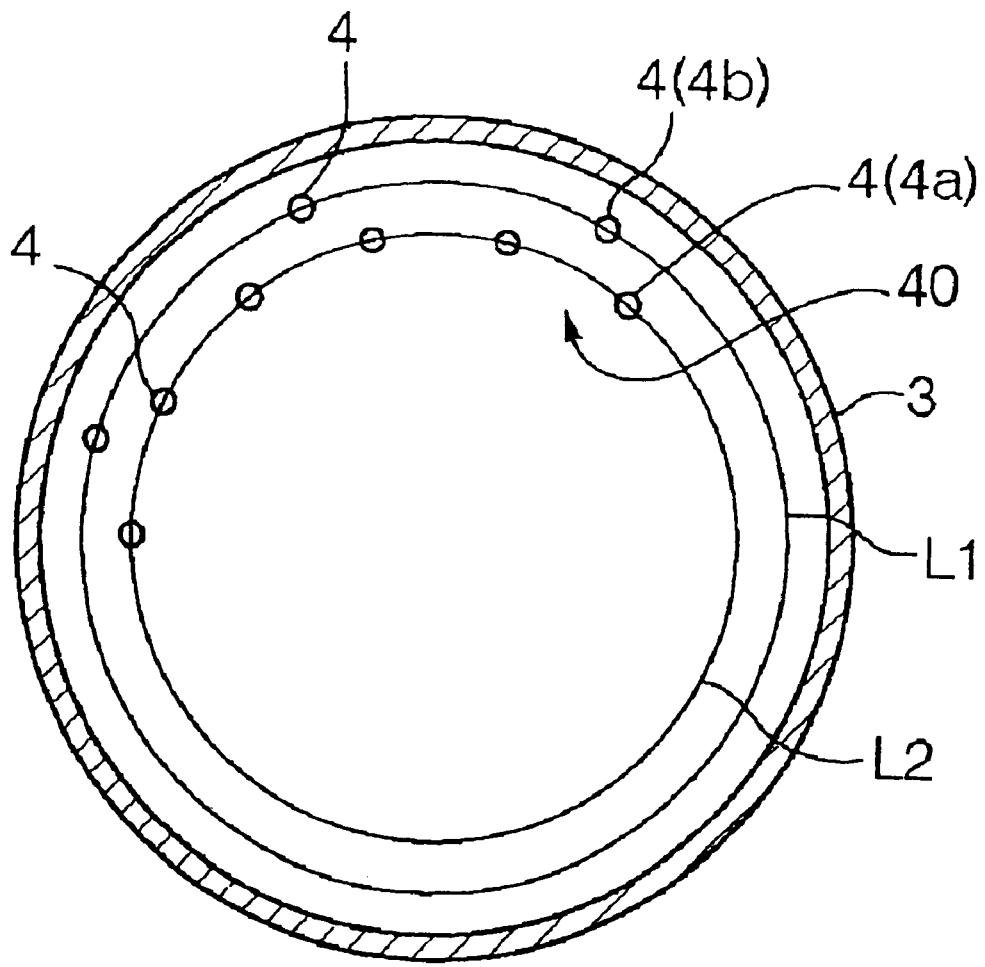
FIG. 19 is a plan view of the heater shown in FIG. 18.

A heater 40 shown in FIGS. 18 and 19 has a plurality of straight heating elements 4 (4b) arranged on a large-diameter imaginary cylinder L1 in a circumferential direction, and a plurality of U-shaped heating elements 4 (4a) arranged on a small-diameter imaginary cylinder L2 coaxial with and disposed inside the large-diameter imaginary cylinder L1. As viewed in FIG. 19, a radius passing each of the straight heating elements 4 (4b) bisects each of the U-shaped heating elements 4 (4a).

Figure 20:
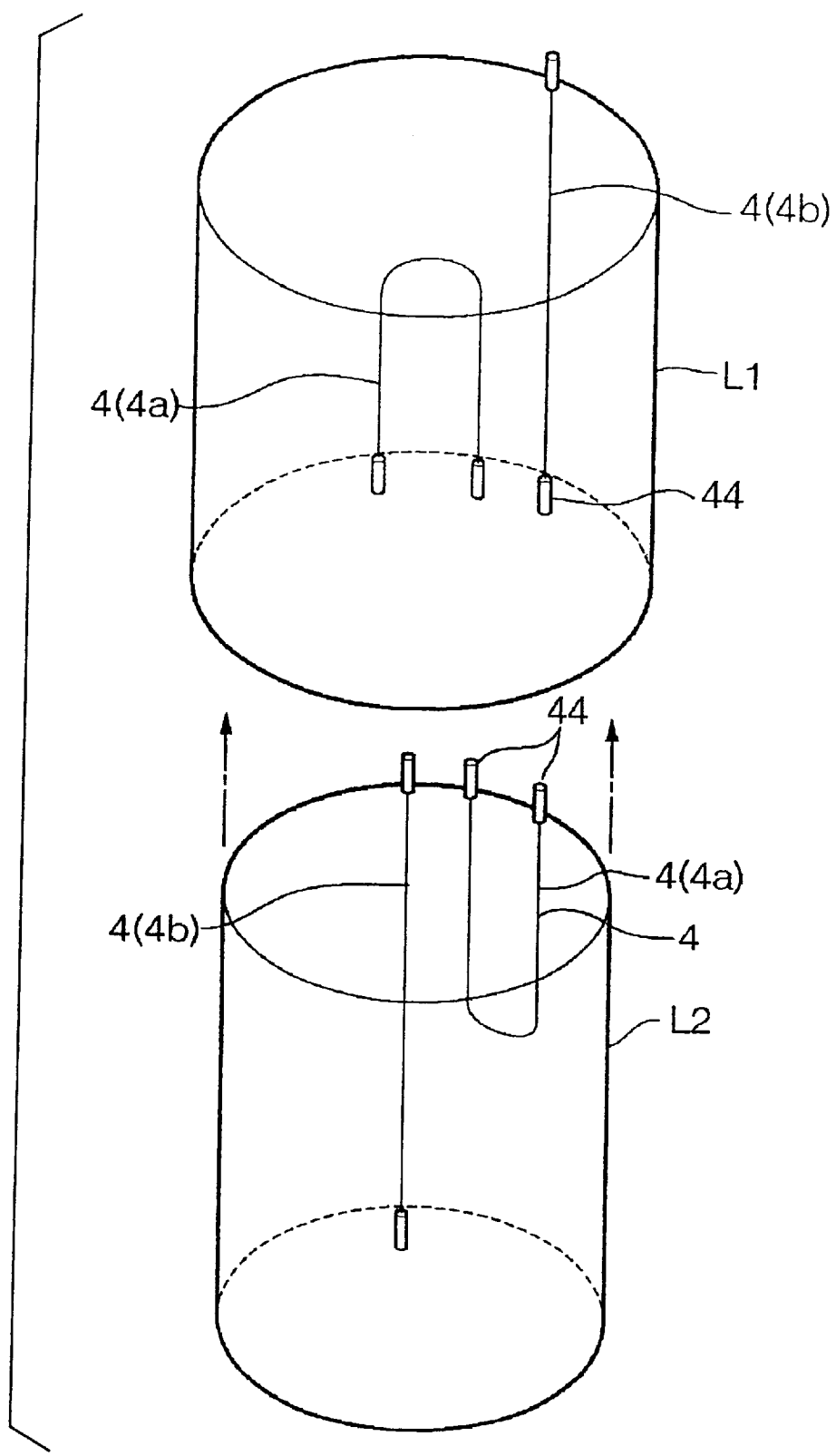
FIG. 20 is an exploded perspective view of another example of a heater.
Figure 21:
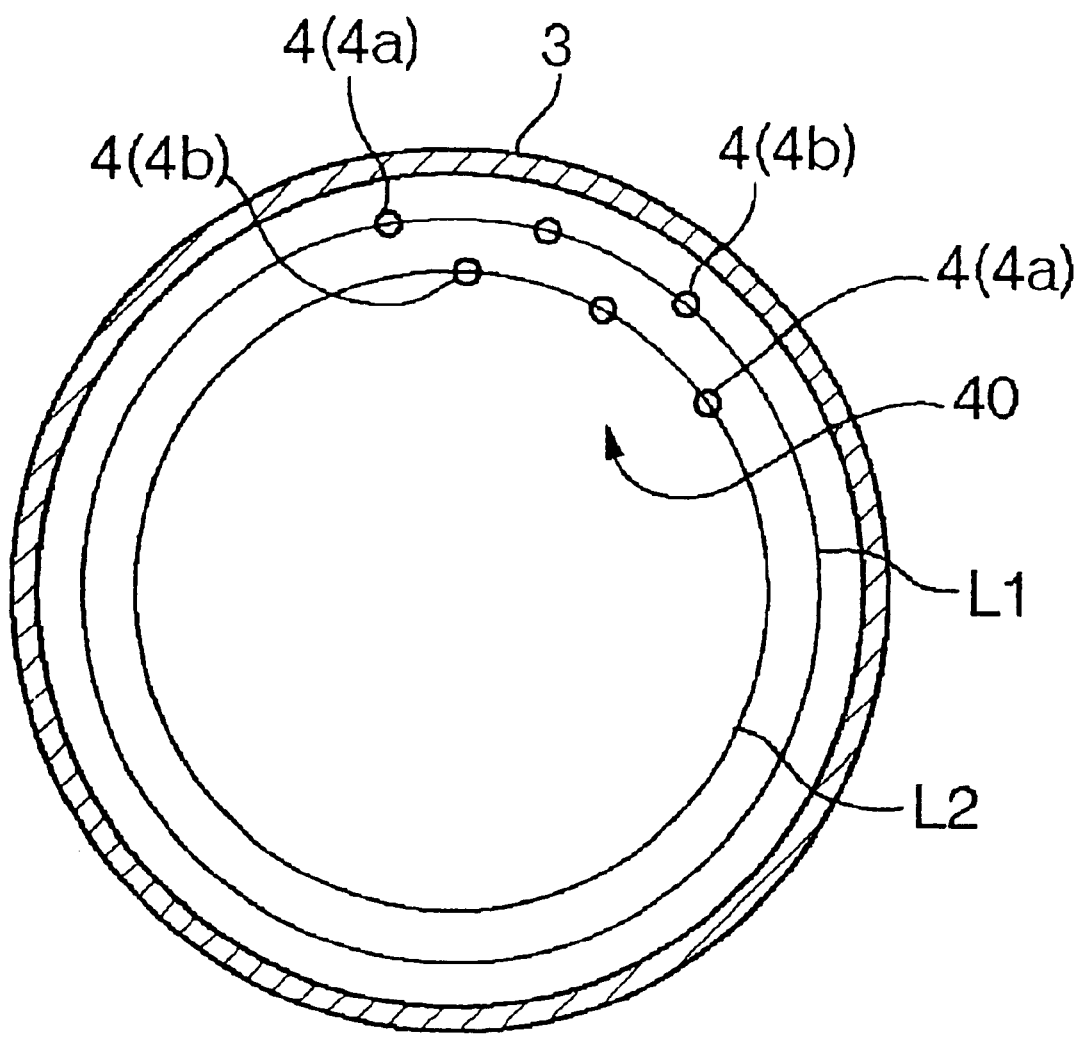
FIG. 21 is a plan view of the heater shown in FIG. 20.

A heater 40 shown in FIGS. 20 and 21 has a plurality of straight heating elements 4 (4b) and a plurality of U-shaped heating elements 4 (4a) alternately arranged on a large-diameter imaginary cylinder L1 and a small-diameter imaginary cylinder L2. The heater elements 4 arranged on the small-diameter imaginary cylinder L2 may be supported by support members of any suitable shape extended inward from a heat reflector 3.

In the foregoing examples, the heating elements 4 are arranged on the two imaginary cylinders L1 and L2. The heating elements 4 may be arranged on three or more imaginary cylinders of different diameters.

When the heating elements 4 are thus arranged in a three-dimensional pattern, the heat generation pattern as viewed from the processing atmosphere can be further minutely adjusted. Consequently, the uniformity of temperature distribution in the processing atmosphere can be further improved.

Figure 22:
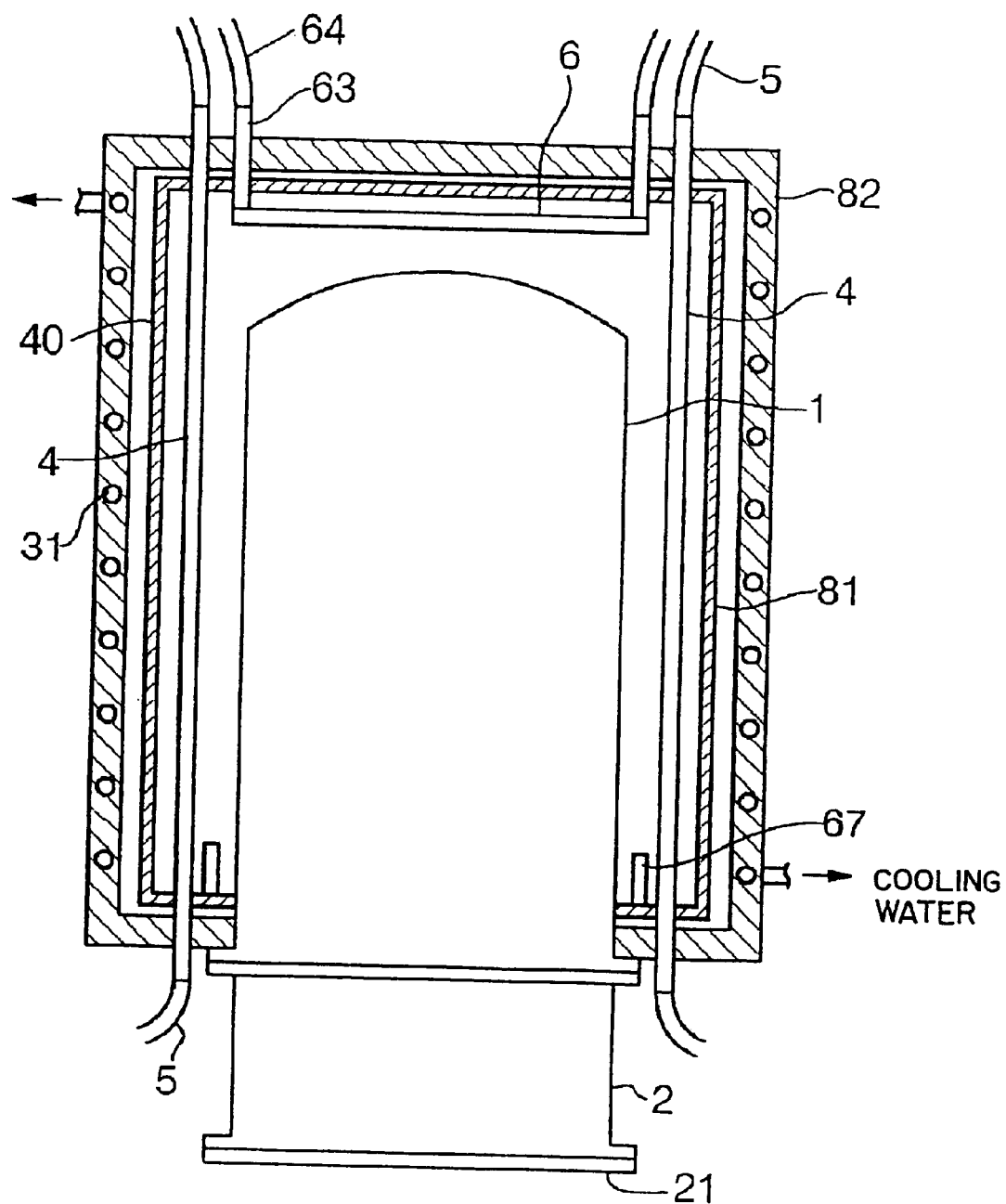
FIG. 22 is a schematic sectional view of an essential part of a vertical thermal processing apparatus of a second embodiment according to the present invention.

FIG. 22 is a schematic sectional view of an essential part of a vertical thermal processing apparatus of a second embodiment according to the present invention. The vertical thermal processing apparatus shown in FIG. 22 differs from the thermal processing apparatus of the first embodiment in that the vertical thermal processing apparatus of the second embodiment has a furnace body formed of a first cylindrical heat reflector 81 and a second cylindrical heat reflector 82 surrounding the first heat reflector 81 with a space formed between the first heat reflector 81 and the second heat reflector 82. Heating elements 4 forming a heater 40 are arranged, similarly to those of the first embodiment, along the inner circumference of the side wall of the first heat reflector 81. The first heat reflector 81 is formed by, for example, coating the inner surface of a quartz cylinder with an alumina coating. The alumina coating may consist of fine alumina particles. The alumina coating reflects radiation heat radiated by the heater 40 in a multiple reflection mode. More concretely, the first heat reflector 81 reflects about 80%, for example, of radiation heat received thereon. The inner surface of the second heat reflector 82 is finished in a heat reflecting surface, such as a mirror-finished surface. The second heat reflector 82 reflects radiation heat penetrated the first heat reflector 81. Thus, heat dissipation into the ambient atmosphere can be suppressed, which enhances the thermal efficiency of the thermal processing apparatus. The inner surface of the second heat reflector 82 does not need to be mirror-finished.

Figure 23:
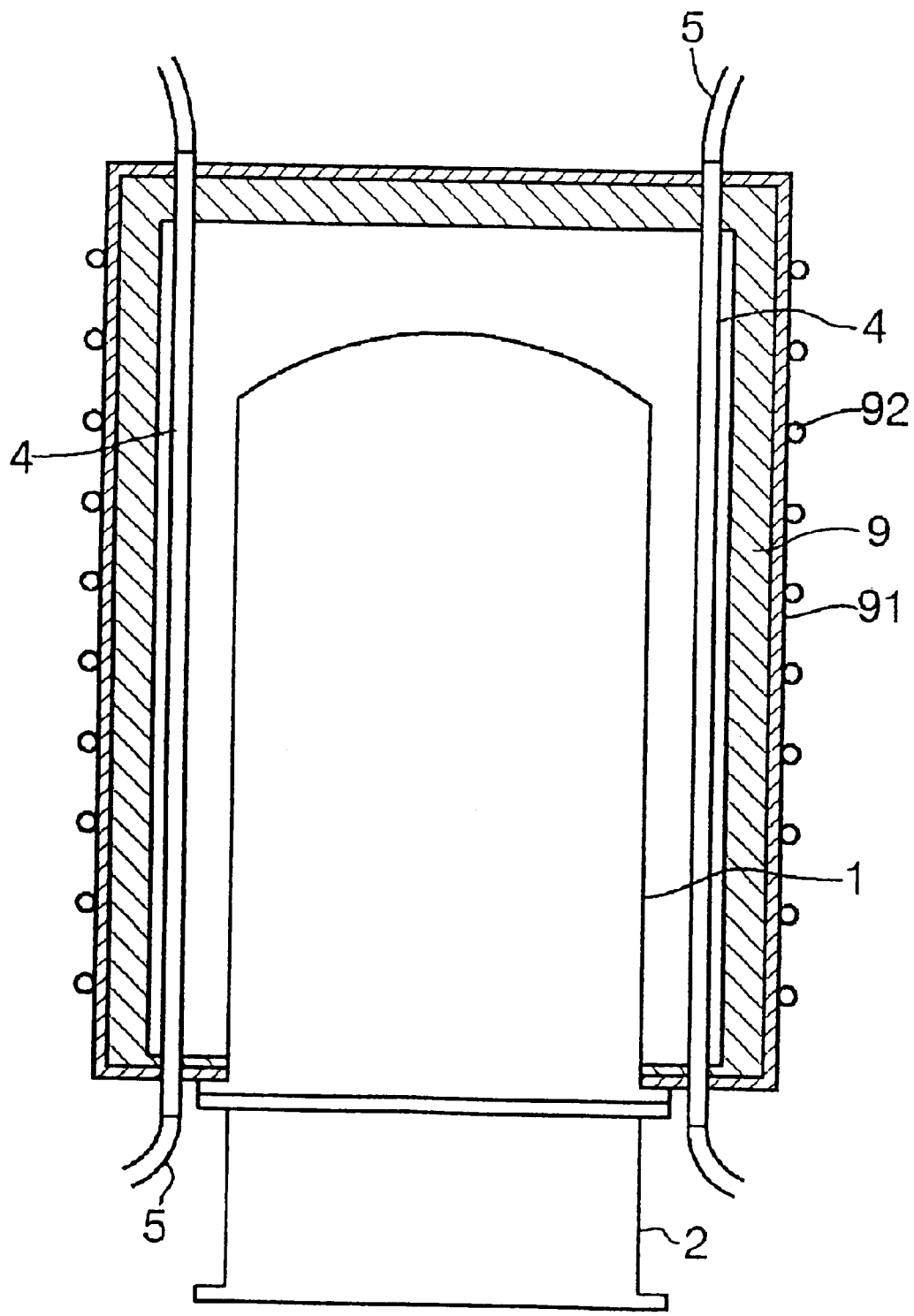
FIG. 23 is a schematic sectional view of an essential part of a vertical thermal processing apparatus of a third embodiment according to the present invention.

The foregoing thermal processing apparatuses are provided with the heat reflectors (3, 81, 82), respectively. A vertical thermal processing apparatus of a third embodiment according to the present invention shown in FIG. 23 is not provided with any heat reflector but with a furnace body including a cylindrical heat insulating structure 9 made of, for example, alumina, silica or alumina-silica and an outer plate 91 made of, for example, a metal covering the outer surface of the heat insulting structure 9. A cooling water pipe 92 forming a cooling medium passage is helically wound around the outer plate 91. Heating elements 4 may be arranged along the inner surface of the side wall of the heat insulating structure 9.

Preferably, a clearance of, for example 3 mm or above is formed between the inner circumference of the heat insulating structure 9 and the heating elements 4, because it is possible that temperature of local parts of the heating elements 4 rises excessively and the heating elements 4 are damaged if the heating elements 4 are in contact with the heat insulating structure 9, and because it is possible that a very small amount of alkaline impurities contained in the heat insulting structure 9 permeates the quarts tube 42 to devitrify the quartz tube 42 (phase transition) when the quartz tube 42 is heated to a high temperature. If the quartz tube 42 is devitrified, heat accumulates in the heating elements 4 and the heating elements 4 may be broken. If the quartz tube 42 is devitrified locally, the uniformity of temperature distribution in the processing atmosphere may possibly be deteriorated because the amount of radiation heat transmitted through devitrified parts of the quartz tube 42 differs from that transmitted through other parts of the quartz tube 42, and the quartz tube 42 may possibly be broken due to difference in thermal expansion between the devitrified parts and other parts of the quartz tube 42.

Figure 24:
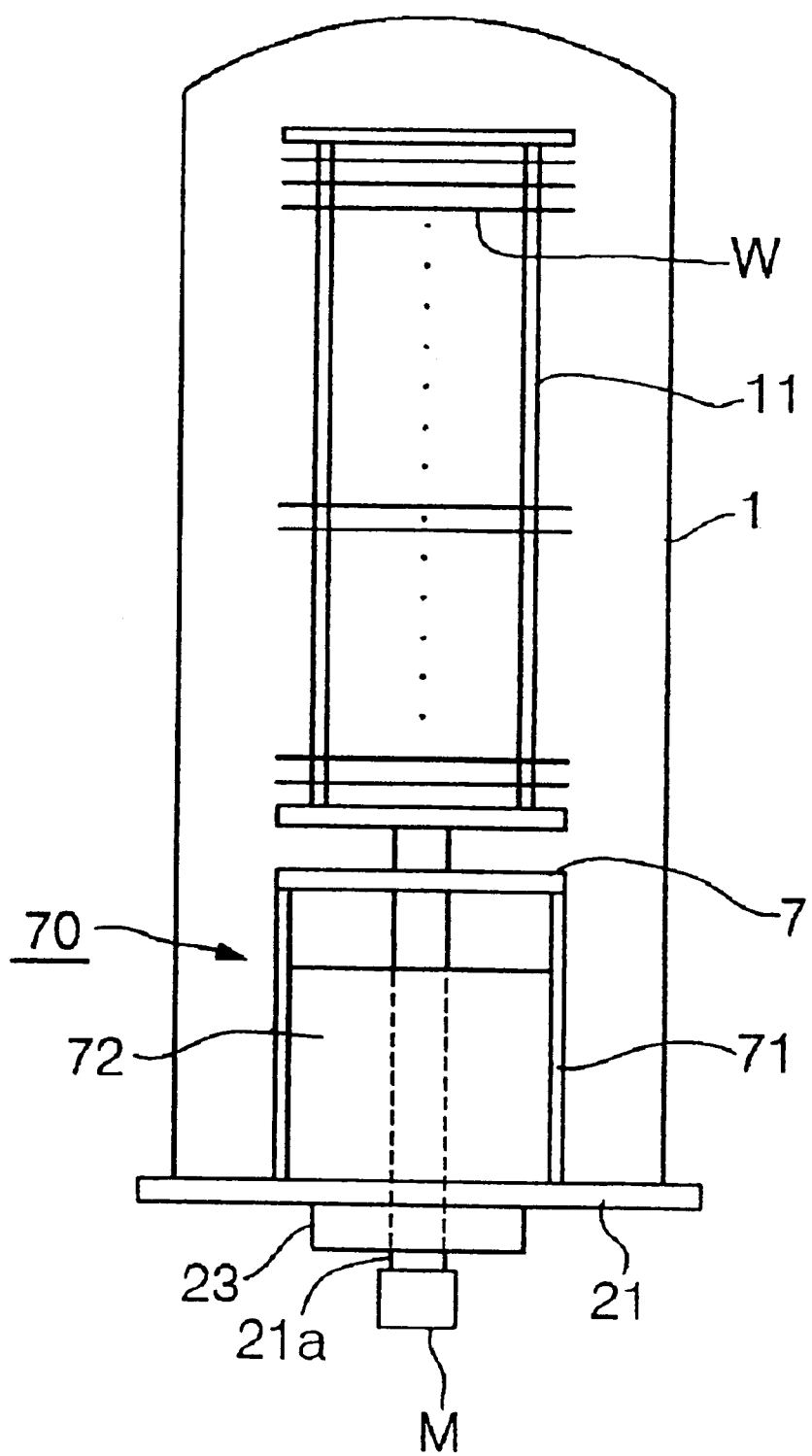
FIG. 24 is a schematic sectional view of an essential part of a vertical thermal processing apparatus of a fourth embodiment according to the present invention.

In the first embodiment shown in FIG. 1, the third subheater 7 is put on top of the heat insulating unit 22 mounted on the lid 21. However, the third subheater 7 may be supported by a support 71 on the lid 21 and a heat insulating unit 70 may be formed by placing a heat insulating member 72, such as a quartz block or a quartz fin, with a space under the subheater 7 so as to be spaced from the subheater 7, as shown in FIG. 24. In this case, the rotating shaft 21a is extended through the heat insulating unit 70.

When the subheater 7 is disposed below the wafer boat 11, an amount of heat dissipated through a lower part of the processing atmosphere is further reduced. The combined effect of the reduction of heat dissipation and the optional adjustment of the heating pattern of the heater 40 improves the uniformity of temperature distribution in a region around a lower part of the wafer boat 11 still further. When the subheater 7 is supported not rotatably as shown in FIG. 24, electrodes can be easily extended below the lid 21.

Each heating element may be formed by sealing any linear, flexible, resistance heat generating member of a high-purity material other than carbon in a quarts tube or the like. The present invention is applicable not only to a thermal processing apparatus that carries out a CVD process but also to various vertical thermal processing apparatuses for carrying out various processes, such as oxidation processes or diffusion processes. The present invention is applicable not only to a thermal processing apparatus for a batch process but also to a thermal processing apparatus for a single-wafer process. The objects to be processed are not limited to wafers and may be, for example, glass substrates for liquid crystal displays.

According to the present invention, the heating pattern can be adjusted at a high degree of freedom and a processing atmosphere of a highly uniform temperature distribution can be created.

What is claimed is:

1. A thermal processing apparatus comprising:
    a reaction vessel into which an object to be processed is conveyed;
    a furnace body disposed so as to surround the reaction vessel; and
    a heater disposed in a region surrounding the reaction vessel in the furnace body;
    wherein the heater includes heating elements, each having a sealing tube made of a ceramic material and a linear flexible resistance heat generating member sealed by the sealing tube.

2. A thermal processing apparatus according to claim 1, wherein
    the furnace body is a heat insulating body.

3. A thermal processing apparatus according to claim 1, further comprising
    a cooling medium passage for introducing a cooling medium in order to cool the furnace body.

4. A thermal processing apparatus according to claim 1, wherein
    the heater is arranged apart from an inner surface of the furnace body.

5. A thermal processing apparatus according to claim 1, wherein
    the reaction vessel has a shape of a longitudinal cylinder, and
    the heater is disposed in a region facing a side surface of the reaction vessel.

6. A thermal processing apparatus according to claim 5, wherein
    the heater has a longitudinal shape, and
    a plurality of sealing tubes are arranged in parallel with the heater vessel.

7. A thermal processing apparatus according to claim 5, wherein
    the reaction vessel has the shape of the longitudinal cylinder,
    a second heater is disposed in a region facing a top wall of the reaction vessel, and
    the second heater includes heating elements, each having a sealing member made of a ceramic material, and a linear flexible resistance heat generating member sealed by the sealing member.

8. A thermal processing apparatus according to claim 5, wherein
    the reaction vessel has the shape of the longitudinal cylinder,
    a third heater is disposed in a region near to a lower end of the reaction vessel, and
    the third heater includes heating elements, each having a sealing member made of a ceramic material, and a linear flexible resistance heat generating member sealed by the sealing member.

9. A thermal processing apparatus according to claim 1, wherein
    the furnace body has a mirror-finished inner surface.

10. A thermal processing apparatus according to claim 9, wherein
    the heater is arranged apart from an inner surface of the furnace body.

11. A thermal processing apparatus according to claim 1, wherein
    the furnace body includes:
        a first heat reflector having an inner surface serving as a heat reflecting surface, and
        a second heat reflector surrounding the first heat reflector, having an inner surface serving as a heat reflecting surface capable of reflecting radiation heat passed through the first heat reflector.

12. A thermal processing apparatus according to claim 11, wherein
    the second heat reflector has a mirror-finished inner surface.

13. A thermal processing apparatus according to claim 1, wherein
    each of the heating elements has terminals protruded through the furnace body.

14. A thermal processing apparatus according to claim 1, wherein
    the resistance heat generating member has sections respectively having different cross sectional areas.

15. A thermal processing apparatus according to claim 14, wherein
    the resistance heat generating member has sections respectively generating heat at different heat generating rates.

16. A thermal processing apparatus according to claim 1, wherein
    a space surrounding the reaction vessel is divided into a plurality of vertical regions, and the heating elements are disposed in the plurality of vertical regions.

17. A thermal processing apparatus according to claim 1, wherein
    a space surrounding the reaction vessel is divided into a plurality of circumferential regions, and the heating elements are distributed in the plurality of circumferential regions.

18. A thermal processing apparatus according to claim 1, wherein
    a space surrounding the reaction vessel is divided into a plurality of radial regions, and the heating elements are distributed in the plurality of radial regions.

19. A thermal processing apparatus according to claim 1, wherein
    the sealing tube is formed into a longitudinal shape, an U-like shape or a meandering shape.

20. A thermal processing apparatus according to claim 1, wherein
    the resistance heat generating members is a carbon wire formed by bundles of fine carbon fibers.

21. A thermal processing apparatus according to claim 1, wherein
    the ceramics material is quartz.

22. The thermal processing apparatus according to claim 1 further comprising a holder capable of holding a plurality of objects to be processed in a tier-like manner and of being carried into the reaction vessel from below the reaction vessel.

23. The thermal processing apparatus according to claim 22 wherein the holder has a lid capable of hermetically closing an open end of the reaction vessel, and a heat insulating unit disposed on the lid.

24. A thermal processing apparatus according to claim 23, wherein a fourth heater is disposed in the heat insulating unit, and the fourth heater includes heating elements, each having a sealing member made of a ceramic material, and a linear flexible resistance heat generating member sealed by the sealing member.

25. A thermal processing apparatus comprising:

a reaction vessel into which an object to be processed is conveyed;

a furnace body disposed so as to surround the reaction vessel; and a heater disposed in a region surrounding the reaction vessel in the furnace body, wherein the heater includes heating elements, each having a sealing tube made of a ceramic material, and a linear flexible resistance heat generating member sealed by the sealing tube, and the furnace body includes a first heat reflector having an inner surface serving as a heat reflecting surface, and a second heat reflector surrounding the first heat reflector, and having an inner surface serving as a heat reflecting surface capable of reflecting radiation heat passed through the first heat reflector.

26. A thermal processing apparatus according to claim 25, wherein the second heat reflector has a mirror-finished inner surface.

27. A thermal processing apparatus comprising:

a reaction vessel into which an object to be processed is conveyed;

a furnace body disposed so as to surround the reaction vessel; and a heater disposed in a region surrounding the reaction vessel in the furnace body, wherein the heater includes heating elements, each having a sealing tube made of a ceramic material, and a linear flexible resistance heat generating member sealed by the sealing tube, and a space surrounding the reaction vessel is divided into a plurality of vertical regions, and the heating elements are disposed in the plurality of vertical regions.

28. A thermal processing apparatus comprising:

a reaction vessel into which an object to be processed is conveyed;

a furnace body disposed so as to surround the reaction vessel; and a heater disposed in a region surrounding the reaction vessel in the furnace body, wherein the heater includes heating elements, each having a sealing tube made of a ceramic material, and a linear flexible resistance heat generating member sealed by the sealing tube, and a space surrounding the reaction vessel is divided into a plurality of radial regions, and the heating elements are distributed in the plurality of radial regions.

29. A thermal processing apparatus comprising:

a reaction vessel into which an object to be processed is conveyed;

a furnace body disposed so as to surround the reaction vessel;

a heater disposed in a region surrounding the reaction vessel in the furnace body; and a holder capable of holding a plurality of objects to be processed in a tier-like manner and of being carried into the reaction vessel from below the reaction vessel, the holder having a lid capable of hermetically closing an open end of the reaction vessel, and a heat insulating unit disposed on the lid, and wherein another heater is disposed in the heat insulating unit, and the another heater includes heating elements, each having a sealing member made of ceramic material, and a linear flexible resistance heat generating member sealed by the sealing member.

* * * * *